(12) United States Patent
Tak et al.

(10) Patent No.: US 9,190,270 B2
(45) Date of Patent: Nov. 17, 2015

(54) LOW-DEFECT SEMICONDUCTOR DEVICE AND METHOD OF MANUFACTURING THE SAME

(71) Applicant: Samsung Electronics Co., Ltd., Suwon-Si, Gyeonggi-Do (KR)

(72) Inventors: Young-jo Tak, Hwaseong-si (KP); Jae-kyun Kim, Hwaseong-si (KR); Joo-sung Kim, Seongnam-si (KR); Jun-youn Kim, Hwaseong-si (KR); Young-soo Park, Yongin-si (KR); Eun-ha Lee, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/294,823

(22) Filed: Jun. 3, 2014

(65) Prior Publication Data

US 2014/0353677 A1 Dec. 4, 2014

(30) Foreign Application Priority Data

Jun. 4, 2013 (KR) .................. 10-2013-0064336
Jun. 3, 2014 (KR) .................. 10-2014-0067519

(51) Int. Cl.
*H01L 21/02* (2006.01)
*H01L 33/00* (2010.01)
*H01L 33/12* (2010.01)
*H01L 33/32* (2010.01)
*H01S 5/00* (2006.01)
*H01S 5/02* (2006.01)
*H01S 5/343* (2006.01)

(52) U.S. Cl.
CPC ...... *H01L 21/0254* (2013.01); *H01L 21/02381* (2013.01); *H01L 21/02458* (2013.01); *H01L 21/02505* (2013.01); *H01L 33/007* (2013.01); *H01L 33/12* (2013.01); *H01L 33/325* (2013.01); *H01S 5/0014* (2013.01); *H01S 5/021* (2013.01); *H01S 5/34333* (2013.01)

(58) Field of Classification Search
CPC ... H01L 33/12; H01L 33/007; H01L 21/0254; H01L 21/02458; H01L 29/2003
See application file for complete search history.

(56) References Cited

U.S. PATENT DOCUMENTS 4,855,249 A 8/1989 Akasaki et al.
6,372,608 B1 4/2002 Shimoda et al.
(Continued)

FOREIGN PATENT DOCUMENTS

JP 11-298039 10/1999
KR 10-0370395 B1 1/2003
(Continued)

OTHER PUBLICATIONS

Bai, J. et al. "Reduction of Threading Dislocation Densities in AlN/Sapphire Epilayers Driven by Growth Mode Modification" Appl. Phys. Lett., 88, 051903 (2006).

*Primary Examiner* — Tucker Wright
(74) *Attorney, Agent, or Firm* — Harness, Dickey & Pierce, P.L.C.

(57) ABSTRACT

Provided are a low-defect semiconductor device and a method of manufacturing the same. The method includes forming a buffer layer on a silicon substrate, forming an interface control layer on the buffer layer under a first growth condition, and forming a nitride stack on the interface control layer under a second growth condition different from the first growth condition.

19 Claims, 23 Drawing Sheets

(56) References Cited

U.S. PATENT DOCUMENTS

| | | |
|---|---|---|
| 6,645,830 B2 | 11/2003 | Shimoda et al. |
| 6,649,287 B2 | 11/2003 | Weeks, Jr. et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,956,250 B2 | 10/2005 | Borges et al. |
| 6,967,353 B2 | 11/2005 | Suzuki et al. |
| 6,975,703 B2 | 12/2005 | Wilson et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,611,917 B2 | 11/2009 | Emerson et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 2002/0100412 A1* | 8/2002 | Hirayama et al. ............... 117/89 |
| 2002/0110945 A1* | 8/2002 | Kuramata et al. ............... 438/36 |
| 2004/0200406 A1* | 10/2004 | Peczalski et al. ............... 117/95 |
| 2006/0138448 A1* | 6/2006 | Komiyama et al. ........... 257/103 |
| 2007/0069253 A1* | 3/2007 | Sazawa et al. ................. 257/279 |
| 2007/0128743 A1* | 6/2007 | Huang et al. ..................... 438/21 |
| 2008/0171424 A1* | 7/2008 | Li et al. .......................... 438/496 |
| 2009/0008647 A1* | 1/2009 | Li et al. ............................ 257/76 |
| 2009/0127581 A1* | 5/2009 | Ou et al. ......................... 257/103 |
| 2009/0269867 A1* | 10/2009 | Shakuda .......................... 438/29 |
| 2010/0059734 A1* | 3/2010 | Kaneko et al. ................... 257/13 |
| 2011/0266522 A1 | 11/2011 | Kim et al. |
| 2013/0285212 A1* | 10/2013 | Wei et al. ....................... 257/618 |
| 2013/0328079 A1* | 12/2013 | Zhang et al. ..................... 257/98 |

FOREIGN PATENT DOCUMENTS

| | | |
|---|---|---|
| KR | 10-0680700 B1 | 2/2007 |
| KR | 20100025637 A | 3/2010 |
| KR | 20130008280 A | 1/2013 |
| KR | 20130062736 A | 6/2013 |
| KR | 20130081956 A | 7/2013 |

* cited by examiner

LOW-DEFECT SEMICONDUCTOR DEVICE AND METHOD OF MANUFACTURING THE SAME

RELATED APPLICATIONS

This application claims the benefit of priority under 35 U.S.C. §119 from Korean Patent Application No. 10-2013-0064336, filed on Jun. 4, 2013, and Korean Patent Application No. 10-2014-0067519, filed on Jun. 3, 2014 in the Korean Intellectual Property Office, the disclosures of which are incorporated herein in their entirety by reference.

BACKGROUND

1. Field

The present disclosure relates to low-defect semiconductor devices and methods of manufacturing the same, and more particularly, to small-sized semiconductor devices with reduced twist grain boundary generation, and methods of manufacturing the same.

2. Description of the Related Art

Sapphire substrates or silicon carbide (SiC) substrates are widely used to manufacture nitride-based semiconductor devices. However, the sapphire substrates have low electrical conductivity, and are unsuitable for chip fabrication because they are expensive and hard. Also, when the sapphire substrates are epitaxially grown to have a large diameter, they warp at a high temperature due to their low thermal conductivity. Therefore, it is difficult to fabricate large-area sapphire substrates. In order to overcome these limitations, nitride-based semiconductor devices fabricated by using silicon substrates instead of sapphire substrates have been developed.

Since the silicon substrates have higher thermal conductivity than the sapphire substrates, they warp only a little even at a high temperature, at which a nitride thin film grows, and thus, may grow to have a large diameter. However, when a nitride thin film is grown on a silicon substrate, a dislocation density (or defect density) increases due to a lattice constant mismatch between the silicon substrate and the thin film and a crack occurs in the silicon substrate due to the thermal expansion coefficient mismatch therebetween. Therefore, methods for reducing such a dislocation density and methods for preventing such a crack have been extensively researched. However, when the dislocation density is reduced, a tensile stress occurs incidentally. Therefore, when the dislocation density is reduced, the crack occurrence is increased. On the other hand, when the crack occurrence is reduced, the dislocation density is increased. Thus, it is difficult to reduce both the dislocation density and the crack occurrence when the nitride thin film is grown on the silicon substrate.

SUMMARY

Provided are methods of manufacturing small-sized semiconductor devices with low defect density.

Provided are small-sized semiconductor devices with low defect density.

Additional aspects will be set forth in part in the description which follows and, in part, will be apparent from the description, or may be learned by practice of the presented embodiments.

According to an aspect of an embodiment of the present invention, a method of manufacturing a semiconductor device includes: forming a buffer layer on a silicon substrate; forming an interface control layer on the buffer layer under a first growth condition; and forming a nitride stack on the interface control layer under a second growth condition different from the first growth condition, wherein the first growth condition and the second growth condition are controlled such that a ratio of a minimum value of a center value of reflectivity oscillation of the interface control layer to a maximum value of a center value of reflectivity oscillation of the nitride stack has a range of about 0.8 or more.

The ratio of the minimum value of the center value of reflectivity oscillation of the interface control layer to the maximum value of the center value of reflectivity oscillation of the nitride stack may have a range of about 0.9 or more.

The interface control layer may be formed under at least one different condition of temperature, pressure and thickness from the nitride stack.

The interface control layer may be formed at a first temperature of about 900° C. to about 1050° C., and the nitride stack may be formed at a second temperature higher than the first temperature.

The interface control layer may be formed at a first pressure of about 20 torr to about 500 torr, and the nitride stack may be formed at a second pressure equal to or higher than the first pressure.

The interface control layer may be formed to have a thickness of about 2 nm to about 1000 nm.

The interface control layer and the nitride stack may be formed of a Group V/III compound, and the interface control layer may have a Group V material-to-Group III material molar composition ratio of about 20 to about 2000 in growth.

The interface control layer may be formed directly on the buffer layer with no other layer interposed therebetween.

The nitride stack may be formed directly on the interface control layer with no other layer interposed therebetween.

The nitride stack may include at least one nitride semiconductor layer formed of a gallium nitride.

The nitride stack may include a plurality of nitride semiconductor layers that are sequentially formed of homogeneous nitride compounds.

The nitride stack may be formed of $Al_{x1}In_{y2}Ga_{1-x1-y1}N$ where $0 \leq x1$ and $y1 \leq 1$, and $x1+y1 \leq 1$.

The buffer layer may include one or more layers and may be formed of $Al_{x2}In_{y2}Ga_{1-x2-y2}N$ where $0 \leq x2$ and $y2 \leq 1$, and $x2+y2 \leq 1$.

The method may further include forming a nucleus growth layer between the silicon substrate and the buffer layer.

The nucleus growth layer may be formed of an aluminum nitride (AlN).

The method may further include removing the silicon substrate and the buffer layer.

According to another aspect of the present invention, a semiconductor device includes: a silicon substrate; a buffer layer on the silicon substrate; an interface control layer on the buffer layer; and a nitride stack on the interface control layer, wherein the first growth condition and the second growth condition are controlled such that a ratio of a minimum value of a center value of reflectivity oscillation of the interface control layer to a maximum value of a center value of reflectivity oscillation of the nitride stack has a range of about 0.8 or more.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
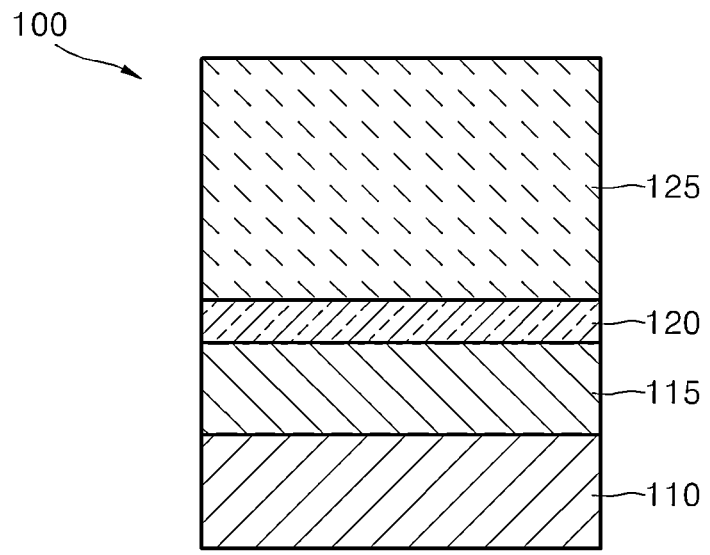
FIG. 1 schematically illustrates a low-defect semiconductor device according to an embodiment of the present invention.

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various features will be described in detail with reference to the attached drawings. However, example embodiments described are not limited thereto.

FIG. 1 schematically illustrates a low-defect semiconductor device according to an embodiment of the present invention. Referring to FIG. 1, a low-defect semiconductor device 100 includes a substrate 110, a buffer layer 115 on the substrate 110, an interface control layer 120 on the buffer layer 115, and a nitride stack 125 on the interface control layer 120. The substrate 110 may be a silicon-based substrate. For example, the substrate 110 may be a silicon substrate.

For example, the silicon substrate may use a (111) plane, and may be cleaned by sulfuric acid hydrogen peroxide mixture, hydrofluoric acid, or deionized water. During cleaning, a natural oxide film and impurities (e.g., organic materials and metals) may be removed from the silicon substrate, and a surface thereof may be terminated or, alternatively, end-capped with hydrogen to be suitable for epitaxial growth. The buffer layer 115 may be formed of at least one selected from the group consisting of aluminum nitride (AlN), aluminum gallium nitride (AlGaN), step grade $Al_xIn_yGa_{1-x-y}N$ ($0 \le x$, $y \le 1$, $x+y \le 1$), and $Al_{x1}In_{y1}Ga_{1-x1-y1}N/Al_{x2}In_{y2}Ga_{1-x2-y2}N$ ($0 \le x1$, $x2$, $y1$, and $y2 \le 1$, $x1 \ne x2$ or $y1 \ne y2$, $x1+y1 \le 1$, and $x2+y2 \le 1$) superlattices.

For example, the buffer layer 115 may be provided to reduce a dislocation caused by a lattice constant mismatch between the substrate 110 and the interface control layer 120 and to suppress the occurrence of a crack in the substrate 110 caused by a thermal expansion coefficient mismatch therebetween. While one buffer layer is illustrated in FIG. 1, a plurality of buffer layers may be provided. Also, one of the plurality of buffer layers may act as a nucleus growth layer. Hereinafter, the buffer layer and the nucleus growth layer will be described separately. For example, the buffer layer 115 may include a plurality of AlGaN/AlN/AlGaN layers. However, embodiments of the present invention are not limited thereto, and other examples will be described later.

The interface control layer 120 may be formed of $Al_{x3}In_{y3}Ga_{1-x3-y3}N$ ($0 \le x3$, $y3 \le 1$, and $x3+y3 \le 1$). For example, the interface control layer 120 may be formed of a gallium nitride. The buffer layer 115 and the interface control layer 120 may be formed of different materials for discrimination (or, alternatively, selectivity) therebetween. For example, the buffer layer 115 may be formed of an aluminum (Al) nitride, and the interface control layer 120 may be formed of a nitride that does not contain Al. For example, the buffer layer 115 may be formed of an AlGaN, and the interface control layer 21 may be formed of a GaN. However, embodiments of the present invention are not limited thereto.

A dislocation loop may be formed at the interface between the buffer layer 115 and the interface control layer 120 to reduce a dislocation density thereof. For example, when the buffer layer 115 is formed of $Al_xGa_{1-x}N$ ($0<x \le 1$), an Al composition may have a single composition or a composition that decreases sequentially. For example, the Al composition may be decreased sequentially in the step-grade of $Al_{0.7}Ga_{0.3}N \to Al_{0.5}Ga_{0.5}N \to Al_{0.3}Ga_{0.7}N$. In this case, the lattice constant mismatch and the thermal expansion coefficient mismatch between the buffer layer 115 and the interface control layer 120 may be reduced to effectively generate a compressive stress in epitaxial growth. This compressive stress may reduce a tensile stress generated in epitaxial cooling, thereby reducing the crack occurrence. Also, the buffer layer 115 may generate threading dislocation bending, thereby reducing a defect. As the thickness of the buffer layer 115 increases, the compressive stress relaxation of the nitride stack 125 formed thereon may be reduced and the defect may be reduced. However, as the thickness of the buffer layer increases, a process time increases. Therefore, it may be necessary to reduce the thickness of the buffer layer 115 for suitable defect reduction. For example, the buffer layer 115 may have a thickness of hundreds of nanometers to several micrometers.

The substrate 110 may be removed during or after fabrication of the semiconductor device 100. Also, the buffer layer 115 may be removed together with the substrate 110. Since the silicon substrate does not transmit light, the substrate may be selectively removed for transmission of light emitted from the semiconductor device 100.

The interface control layer 120 may reduce the generation of a twist grain boundary at an interface with the nitride stack 125. The interface control layer 120 may have a thickness of about 2 nm to about 1000 nm, and may be formed such that the ratio of the roughness of the interface control layer 120 to the roughness of the buffer layer 115 is about 3 or less.

As the thickness of the interface control layer 120 is increased, the generation of a twist grain boundary at the interface between the interface control layer 120 and the nitride stack 125 may be reduced. However, when the thickness of the interface control layer 120 is increased, the crystallinity of an entire thin film may be degraded. This is because the defect may increase since the interface control layer 120 grows at lower temperature than a nitride semiconductor layer. Therefore, it may be desirable to reduce the generation of a twist grain boundary while reducing the thickness of the interface control layer 120.

When the twist grain boundary is reduced, the defect of the nitride stack 125 formed on the interface control layer 120 may be reduced. That is, the interface control layer 120 may have a thickness of about 2 nm to about 1000 nm and may have a roughness ratio of about 3 or less with respect to the buffer layer 115, thereby reducing the defect of the nitride stack 125 formed thereon. Therefore, in comparison with a thick layer that does not use an interface control layer, the same level of crystallinity may be obtained at a small thickness, and the thickness of the entire structure thereof may be reduced. Also, the process time and cost for an epitaxial growth process for the semiconductor device according to an embodiment of the present invention may be reduced.

The nitride stack 125 may include one or more nitride semiconductor layers. The nitride stack 125 may be a target layer that is to be grown on the buffer layer 115. The nitride semiconductor layer may be formed of $Al_{x4}In_{y4}Ga_{1-x4-y4}N$ (0≤x4 and y4≤1, and x4+y4<1). When the nitride stack 125 includes a plurality of nitride semiconductor layers, the nitride semiconductor layers may be divided according to functions or composition materials. For example, the plurality of nitride semiconductor layers may be discriminated by different composition ratios, doping/undoping, or different doping concentrations. For example, the nitride stack 125 may include an undoped GaN layer and an n-type GaN layer.

Figure 2:
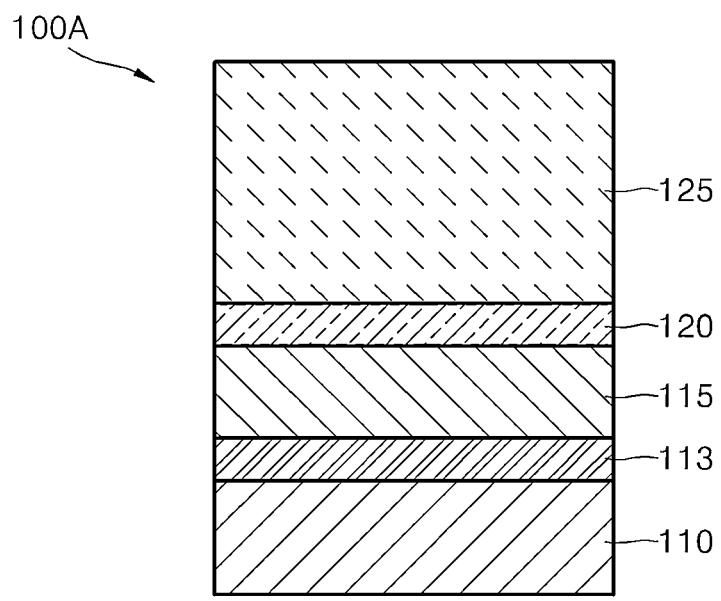
FIG. 2 illustrates an example in which a nucleus growth layer is further provided in the low-defect semiconductor device illustrated in FIG. 1.

FIG. 2 illustrates an example in which a nucleus growth layer is further provided in the semiconductor device 100 illustrated in FIG. 1. A semiconductor device 100A illustrated in FIG. 2 may further include a nucleus growth layer 113 between the substrate 110 and the buffer layer 115. The nucleus growth layer 113 may be formed of $Al_{x4}In_{y4}Ga_{1-x4-y4}N$ (0≤x4 and y4≤1, and x4+y4≤1). The nucleus growth layer 113 may have a thickness of tens of nanometers to hundreds of nanometers. Also, the nucleus growth layer 113 and the buffer layer 115 may include different composition materials.

For example, the nucleus growth layer 113 may be formed of an AlN. The nucleus growth layer 113 may prevent a melt-back phenomenon caused by a reaction between the substrate 110 and the nitride stack 125, and may enable the buffer layer 115 or the interface control layer 120 to be well wetted. In the growth process of the nucleus growth layer 113, an Al source is injected before an nitrogen (N) source. This is to prevent the substrate 100 from being exposed first and nitrided when the N source is injected before the Al source.

Figure 3:
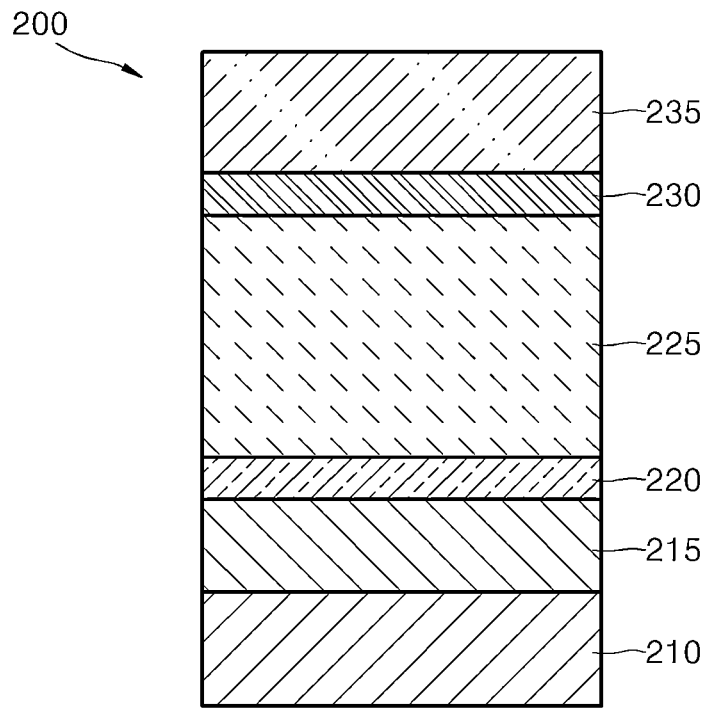
FIG. 3 illustrates an example in which an active layer is further provided in the low-defect semiconductor device illustrated in FIG. 1.

FIG. 3 illustrates a semiconductor device according to an embodiment of the present invention. Referring to FIG. 3, a semiconductor device 200 includes a substrate 210, a buffer layer 215 on the substrate 210, an interface control layer 220 on the buffer layer 215, and a first nitride stack 225 on the interface control layer 220. Also, an active layer 230 may be provided on the first nitride stack 225, and a second nitride stack 235 may be provided on the active layer 230. The substrate 210 may be a silicon-based substrate, and may be, for example, a silicon substrate. The buffer layer 215 and the interface control layer 220 has substantially the same configurations and functions as the buffer layer 115 and the interface control layer 120 described with reference to FIG. 1, and thus a detailed description thereof will be omitted herein.

The first nitride stack 225 may include one or more nitride semiconductor layers. The nitride semiconductor layer of the first nitride stack 225 may be doped with a dopant of a first type or may not be doped. The first dopant type may be an n dopant. For example, among the nitride semiconductor layers of the first nitride stack 225, the nitride semiconductor layer directly contacting the active layer 230 may be doped with the first dopant type, for example, an n dopant. However, the first dopant type may also be a p dopant.

The second nitride stack 235 may include one or more nitride semiconductor layers. The nitride semiconductor layer of the second nitride stack 235 may be doped with a dopant of a second type or may not be doped. The second dopant type may be a p dopant. However, when the nitride semiconductor layer of the first nitride stack 225 is doped with a p dopant, the nitride semiconductor layer of the second nitride stack 235 may be doped with an n dopant. For example, among the nitride semiconductor layers of the second nitride stack 235, the nitride semiconductor layer directly contacting the active layer 230 may be doped with the second dopant type, for example, a p dopant.

The active layer 230 may have a multiple quantum well structure. The active layer 230 may have a GaN/InGaN multiple quantum well structure. As electrons (or holes) from the first nitride stack 225 combine with holes (or electrons) from the second nitride stack 235, light may be emitted from the active layer 230.

Since the semiconductor device according to an embodiment of the present invention includes the silicon substrate, a large-diameter wafer may be fabricated. The semiconductor device according to an embodiment of the present invention may be applied to a light emitting diode, a Schottky diode, a laser diode, a field effect transistor, or a power device.

Figure 4:
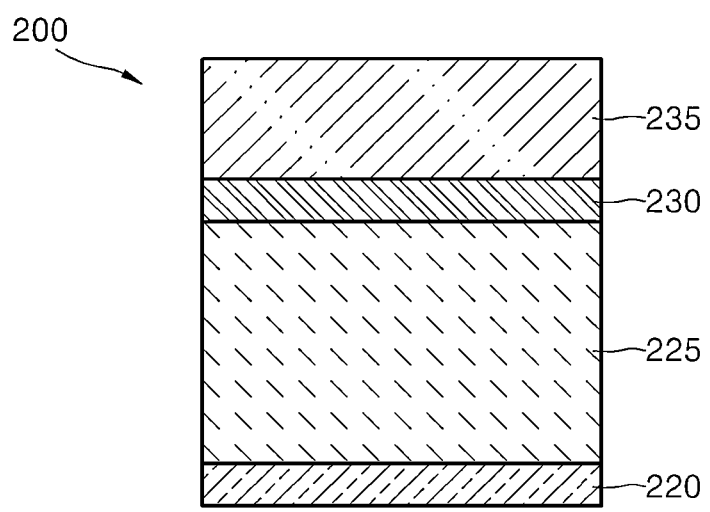
FIG. 4 illustrates a state in which a substrate and a buffer layer are removed from the low-defect semiconductor device illustrated in FIG. 3.

As illustrated in FIG. 4, the substrate 210 and the buffer layer 215 may be removed form the semiconductor device 200. For example, the substrate 210 and the buffer layer 215 may be removed from the semiconductor device 200 such that light from the active layer 230 may be emitted downward. Although not illustrated, when the substrate 210 and the buffer layer 215 are removed, a support substrate may be further provided on the second nitride stack 235 to support the semiconductor device 200.

Next, the interface control layer 120 and the nitride stack 125 will be described in detail with reference to FIG. 1.

In a method of manufacturing the semiconductor device according to an embodiment of the present invention, a growth condition may be controlled to reduce the roughness of the interface control layer 120. An interface control layer is formed on a buffer layer under a first growth condition to control the ratio of the roughness of the interface control layer 120 to the roughness of the buffer layer. Then, the nitride stack 125 is formed on the interface control layer 120 under a second growth condition different from the first growth condition. For example, the interface control layer 120 may be formed by controlling at least one of temperature, pressure, and thickness. The interface control layer 120 may be formed of a Group V/III compound, and the interface control layer 120 may be grown by controlling the molar composition ratio between the Group V material and the Group III material of the interface control layer 120. Then, the growth condition of the interface control layer 120 may be controlled to be different from the growth condition of the nitride stack 125.

For example, the interface control layer 120 may be grown at a temperature of about 900° C. to about 1050° C. For example, the interface control layer 120 may be grown at a pressure of about 20 torr to about 500 torr.

FIGS. 5A to 5D illustrate a change in reflectivity according to a change in the growth temperature of an interface control layer of a semiconductor device.

Figure 5A:
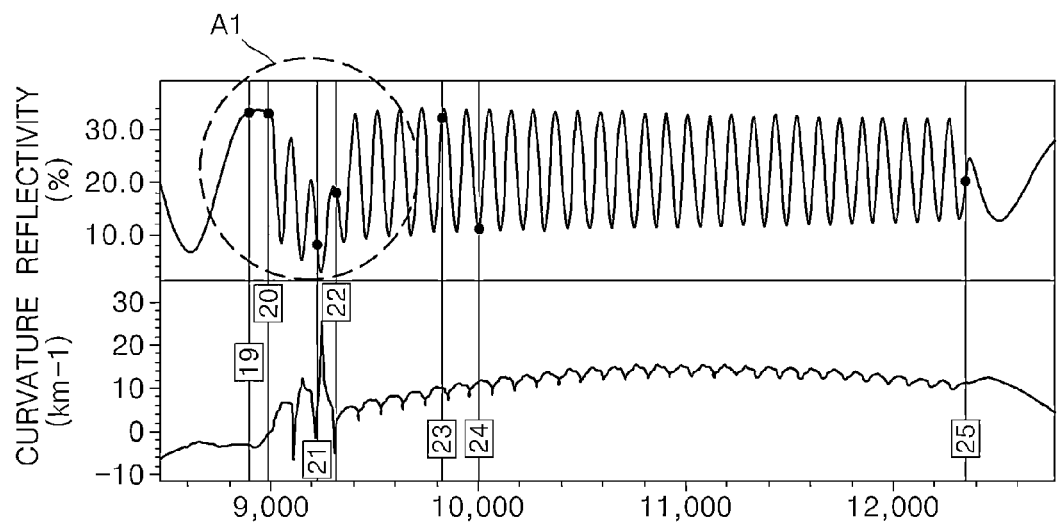
FIGS. 5A to 5D illustrate a change in reflectivity according to a change in the growth temperature of an interface control layer of a semiconductor device.

FIG. 5A illustrates a curvature and reflectivity (%) in the thickness direction of a semiconductor device when the interface control layer 120 is grown at about 900° C. A portion (20-21 section) represented by A1 represents a portion corresponding to the interface control layer 120. The reflectivity may be an index for determining the roughness of the surface thereof. For example, when the surface roughness is high, the reflectivity may be reduced because light is scattered on the surface. For reference, in the following experiments, after growth of the interface control layer 120, a nitride semiconductor layer was grown at a relatively high temperature of about 1050° C. In an example illustrated in A1 of FIG. 5A, the ratio of the minimum value of a center value of reflectivity oscillation of the interface control layer 120 to the maximum value of a center value of reflectivity oscillation of the nitride stack 125 may be about 0.48. The center value of reflectivity oscillation may represent the center value of an amplitude at each period of reflectivity oscillation. The intensity of light, which is reflected from a thin film after laser light is irradiated onto the film, is measured to monitor the state of the thin film while growing the thin film. In this case, since the sum of light reflected outside the thin film and light reflected inside the thin film is measured, when the thickness of the thin film changes, the measured intensity of light oscillates due to an interference effect. Herein, the center value of reflectivity oscillation, which is the center value of an oscillation amplitude, may be used as a representative value of a film quality. For example, the maximum value of reflectivity oscillation of the nitride stack 125 may represent the maximum value among the center values of reflectivity oscillation in a nitride stack section. The minimum value of reflectivity oscillation of the interface control layer 120 may represent the minimum value among the center values of reflectivity oscillation in an interface control layer section.

For example, in FIG. 5A, the maximum value among the center values of reflectivity oscillation of the nitride stack 125 in a 22-25 section may be obtained, and the minimum value among the center values of reflectivity oscillation of the interface control layer 120 in a 20-21 section may be obtained.

Figure 5B:
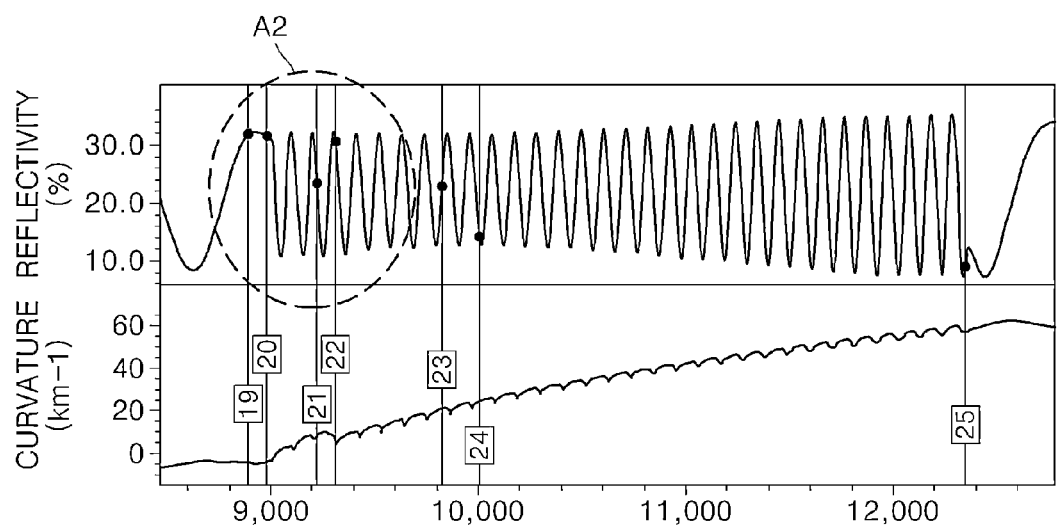

FIG. 5B illustrates a curvature and reflectivity (%) in the thickness direction of a semiconductor device when the interface control layer 120 is grown at about 950° C. A portion (20-21 section) represented by A2 represents a portion corresponding to the interface control layer 120. The roughness of the interface control layer 120 illustrated in FIG. 5B may have a value of about r.m.s 7.1 nm. In FIG. 5B, the maximum value among the center values of reflectivity oscillation of the nitride stack 125 in a 22-25 section may be obtained, and the minimum value among the center values of reflectivity oscillation of the interface control layer 120 in a 20-21 section may be obtained. In an example illustrated in A1 of FIG. 5B, the ratio of the minimum value of a center value of reflectivity oscillation of the interface control layer 120 to the maximum value of a center value of reflectivity oscillation of the nitride stack 125 may be about 0.99.

Figure 5C:
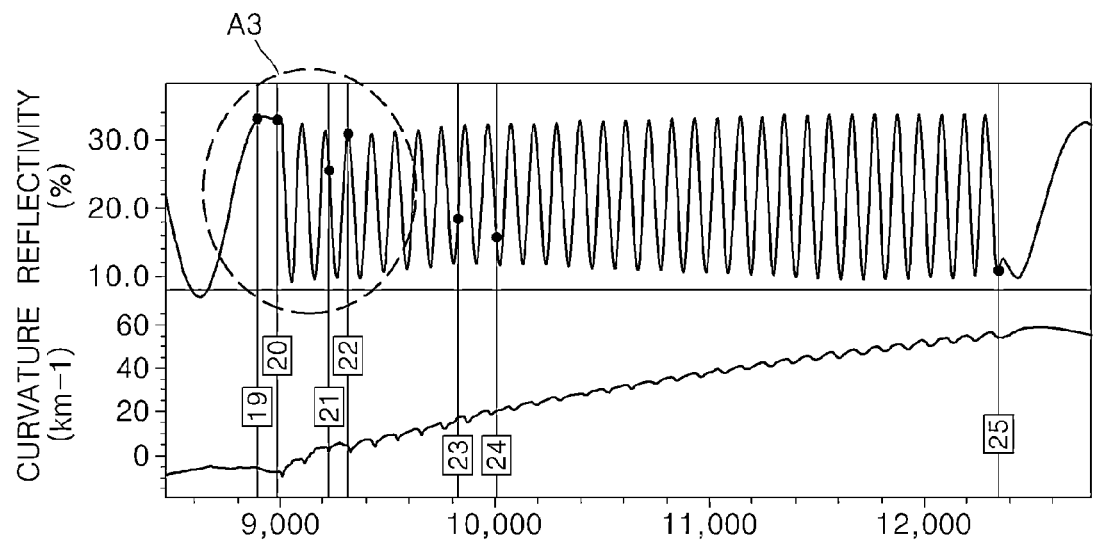
Figure 5D:
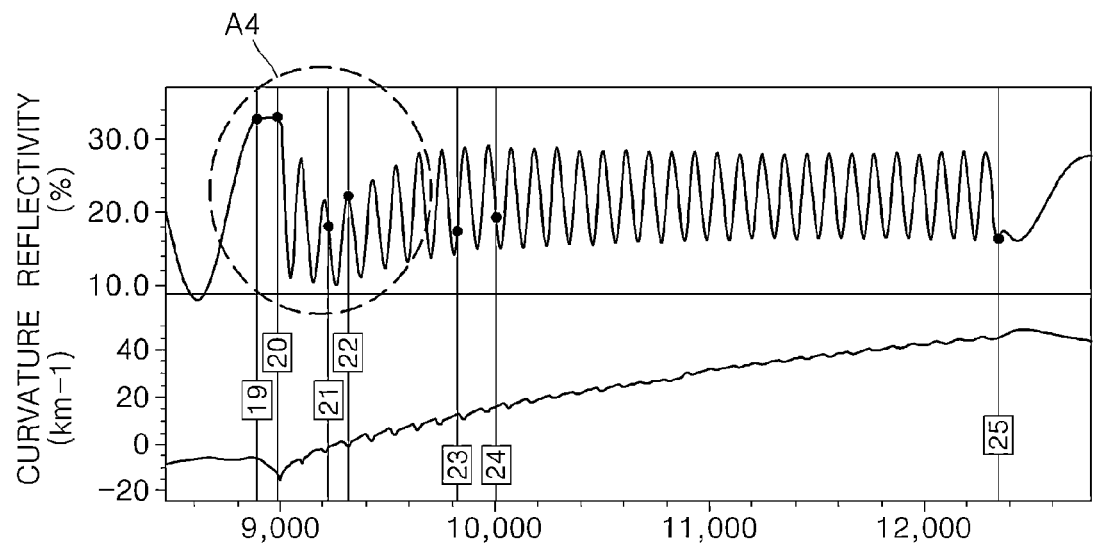

FIG. 5C illustrates a curvature and reflectivity (%) in the thickness direction of a semiconductor device when the interface control layer 120 is grown at about 1,000° C. A portion (20-21 section) represented by A3 represents a portion corresponding to the interface control layer 120. In an example illustrated in A1 of FIG. 5C, the ratio of the minimum value of a center value of reflectivity oscillation of the interface control layer 120 to the maximum value of a center value of reflectivity oscillation of the nitride stack 125 may be about 0.93. FIG. 5D illustrates a curvature and reflectivity (%) in the thickness direction of a semiconductor device when the interface control layer 120 is grown at about 1,050° C. A portion (20-21 section) represented by A4 represents a portion corresponding to the interface control layer 120. The roughness of the interface control layer 120 illustrated in FIG. 5D may have a value of about r.m.s 28.6 nm. In an example illustrated in A1 of FIG. 5D, the ratio of the minimum value of a center value of reflectivity oscillation of the interface control layer 120 to the maximum value of a center value of reflectivity oscillation of the nitride stack 125 may be about 0.71.

Table 1 below shows the ratio of the minimum value RImin of the center values of reflectivity oscillation of the interface control layer 120 to the maximum value RNmax of the center values of reflectivity oscillation of the nitride stack 125 with respect to the growth temperature of the interface control layer 120.

TABLE 1

| | Temperature (° C.) of Interface Control Layer | | | |
|---|---|---|---|---|
| | 900 | 950 | 1000 | 1050 |
| (RImin/RNmax) | 0.48 | 0.99 | 0.93 | 0.71 |

As will be described later, the crystallinity of the semiconductor devices illustrated in FIGS. 5B and 5C was relatively good. Thus, for example, in the semiconductor device according to an embodiment of the present invention, the ratio of the minimum value of a center value of reflectivity oscillation of the interface control layer 120 to the maximum value of a center value of reflectivity oscillation of the nitride stack 125 may be greater than about 0.71. For example, in the semiconductor device according to an embodiment of the present invention, the ratio of the minimum value of a center value of reflectivity oscillation of the interface control layer 120 to the maximum value of a center value of reflectivity oscillation of the nitride stack 125 may have a range of about 0.8 or more. Herein, in most cases, it may be expected that the roughness of the interface control layer 120 will be greater than the roughness of the nitride stack 125 and the center value of reflectivity oscillation of the nitride stack 125 will be greater than the center value of reflectivity oscillation of the interface control layer 120. In this case, the ratio of the minimum value of the center value of reflectivity oscillation of the interface control layer 120 to the maximum value of the center value of reflectivity oscillation of the nitride stack 125 may be smaller than about 1. However, embodiments of the present invention are not limited thereto, and the center value of reflectivity oscillation of the nitride stack 125 and the center value of reflectivity oscillation of the interface control layer 120 may be almost equal to each other. In this case, the ratio of the minimum value of the center value of reflectivity oscillation of the interface control layer 120 to the maximum value of the center value of reflectivity oscillation of the nitride stack 125 may be about 1. Also, depending on the growth condition of the nitride stack 125 and/or the growth condition of the interface control layer 120, the maximum value of the center value of reflectivity oscillation of the nitride stack 125 may be smaller than the minimum value of the center value of reflectivity oscillation of the interface control layer 120. In this case, the ratio of the minimum value of the center value of reflectivity oscillation of the interface control layer 120 to the maximum value of the center value of reflectivity oscillation of the nitride stack 125 may be greater than about 1. For example, the ratio of the minimum value of the center value of reflectivity oscillation of the interface control layer 120 to the maximum value of the center value of reflectivity oscillation of the nitride stack 125 may have a range of about 0.8 to about 1.1.

For example, in the semiconductor device according to an embodiment of the present invention, the ratio of the minimum value of a center value of reflectivity oscillation of the interface control layer 120 to the maximum value of a center value of reflectivity oscillation of the nitride stack 125 may have a range of about 0.9 to about 1.1. The reflection characteristics were non-uniform at the portions A1 and A4. This means that the growth conditions of interface control layers in FIGS. 5A and 5D provide higher surface roughness than the growth conditions of the interface control layers in FIGS. 5B and 5C. The full widths at half maximum (FWHM) (arcsec) of the GaN (002) and GaN (102) X-Ray rocking curve (XRC) of an entire thin film according to each growth temperature are as follows.

TABLE 2

| Temperature (° C.) of | XRC FWHM (arcsec) | |
|---|---|---|
| Interface Control Layer | (002) | (102) |
| 900° C. | N/A | N/A |
| 950° C. | 275" | 323" |
| 1000° C. | 287" | 357" |
| 1050° C. | 316" | 375" |

Herein, the FWHM of XRC represents the FWHM in a light intensity change graph according to the incidence angle of X-Ray. As the FWHM value was smaller, the defect was smaller. The defect was relatively lower at about 950° C. and about 1000° C. As the temperature decreased below about 1050° C., the crystallinity and the compressive stress were improved. When the temperature decreased below about 900° C., the crystallinity was degraded since a coarse interface with lower reflectivity was formed during film growth as in the case of 1050° C. In the case of 900° C., a crack was generated due to increased compressive stress relaxation caused by a high dislocation density, and XRC FWHM could not be obtained, which is represented as N/A (not available) in Table 2.

Figure 6A:
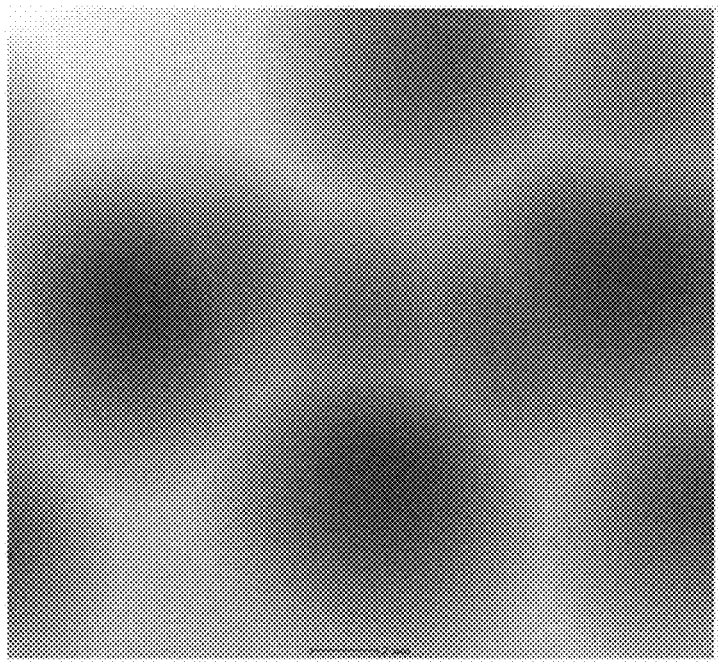
FIGS. 6A and 6B illustrate the grain sizes on the surface of a nitride semiconductor layer depending on the growth temperatures of the interface control layer of a semiconductor device.
Figure 6B:
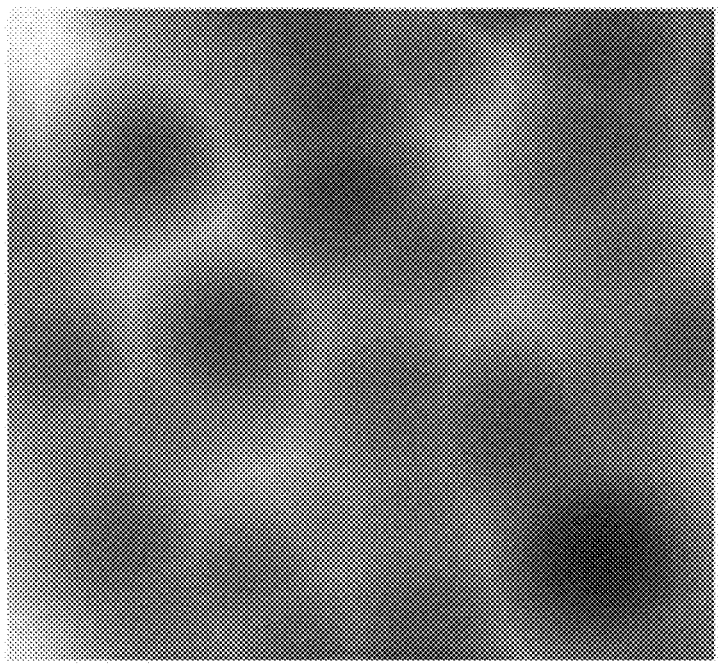

FIGS. 6A and 6B illustrate the grain sizes on the surface of a nitride semiconductor layer depending on the growth temperatures of the interface control layer of a semiconductor device.

FIG. 6A illustrates a scanning transmission election microscope (STEM) image when the interface control layer 120 is formed at about 950° C. FIG. 6B illustrates an STEM image when the interface control layer 120 is formed at about 1050° C. The grain size in the interface control layer 120 of FIG. 6A is larger than the grain size of the interface control layer 120 of FIG. 6B. When the grain size is large, a twist grain boundary generated at the boundary between grains may be reduced.

Figure 7A:
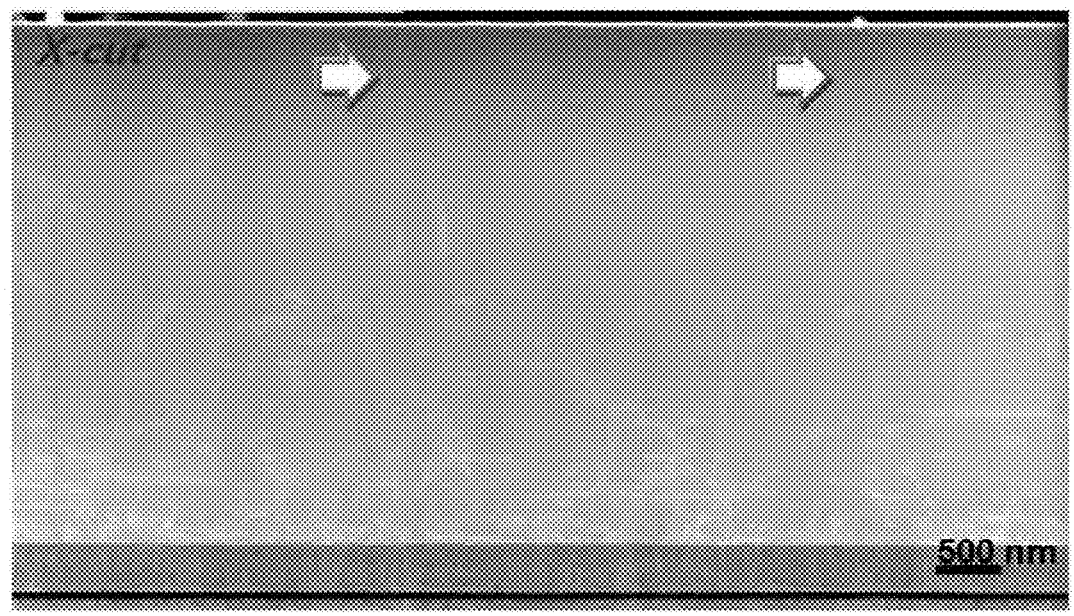
FIGS. 7A and 7B illustrate the horizontal cross-sectional views of the threading dislocations depending on the growth temperatures of the interface control layer of a semiconductor device.
Figure 7B:
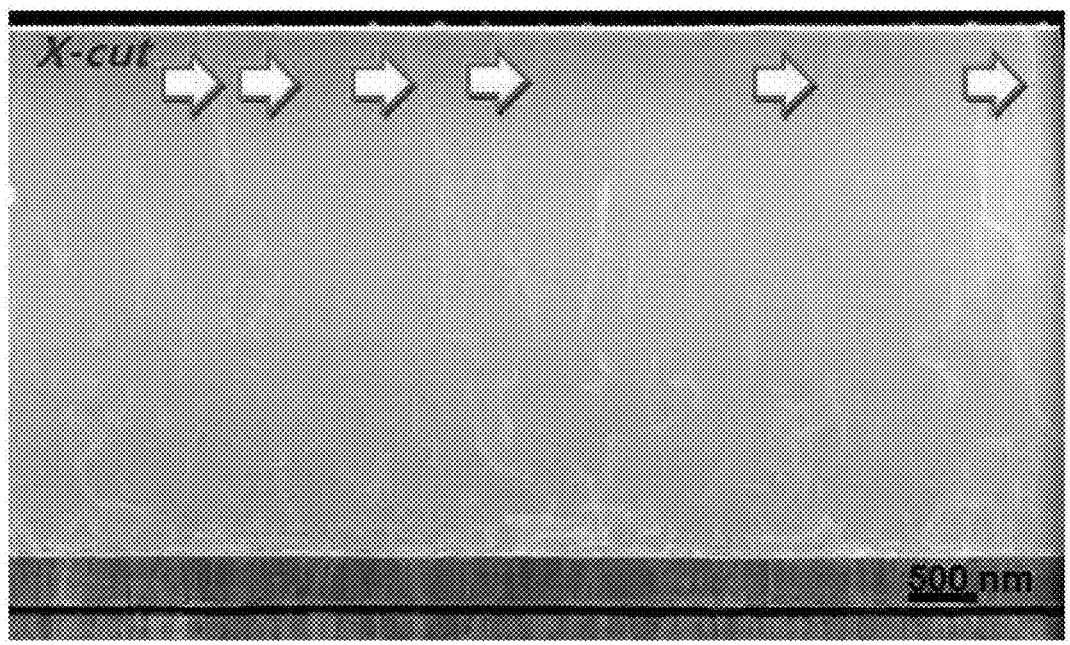
Figure 8A:
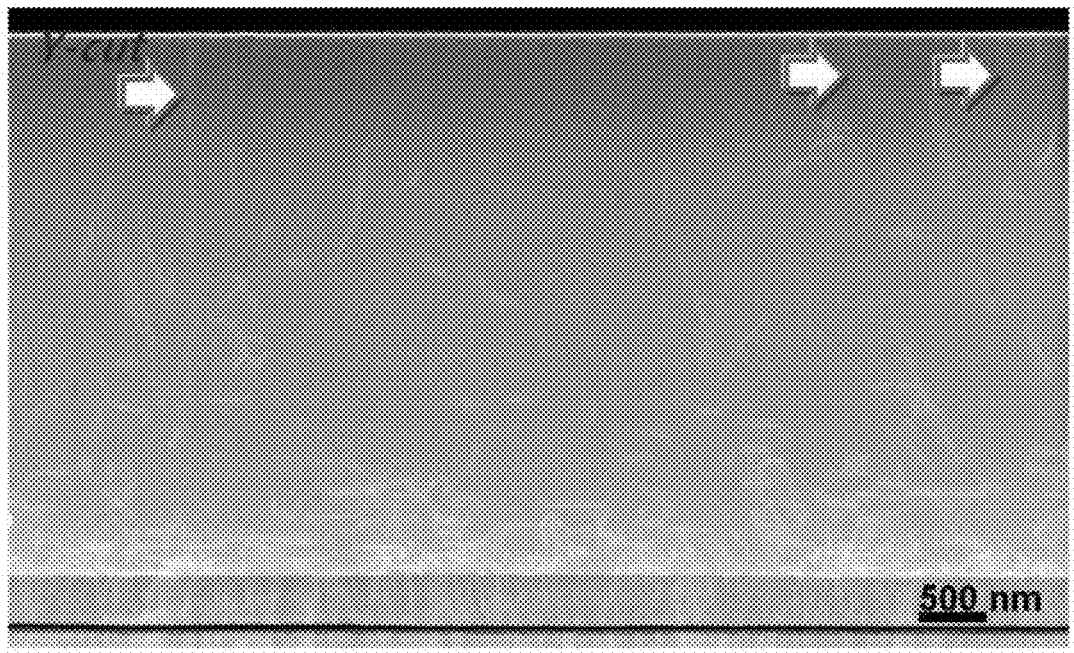
FIGS. 8A and 8B illustrate the vertical cross-sectional views of the threading dislocations depending on the growth temperatures of the interface control layer of a semiconductor device.
Figure 8B:
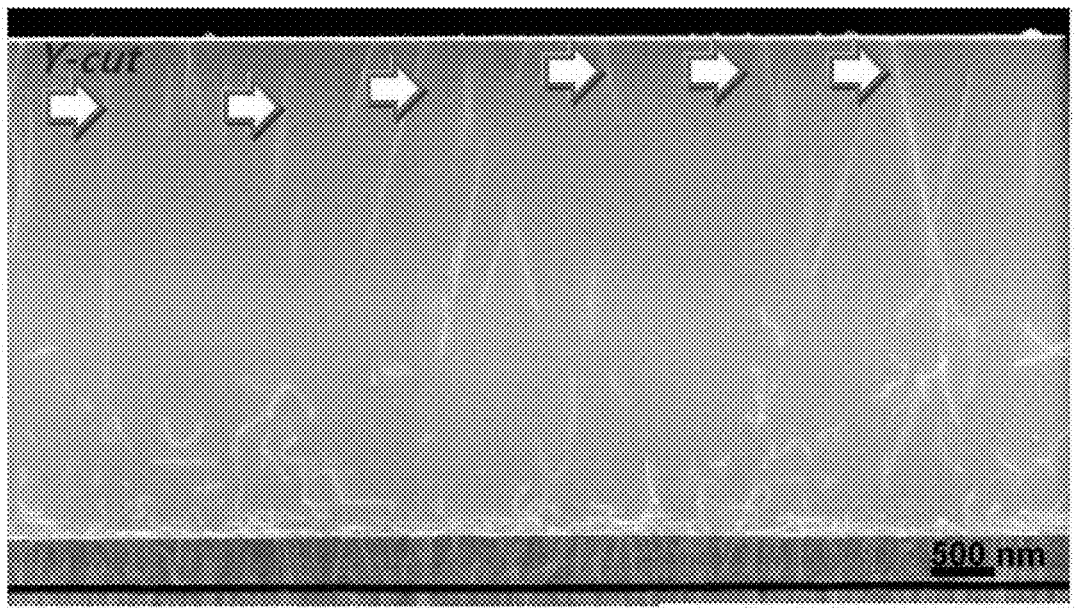

FIGS. 7A and 7B illustrate the horizontal cross-sectional views (the cross-sectional view parallel to the flat-zone direction of Si (111) substrate) of the threading dislocations reaching the surface of an interface control layer when the interface control layer is formed at about 950° C. and about 1050° C., respectively. FIGS. 8A and 8B illustrate the vertical cross-sectional views (the cross-sectional view perpendicular to the flat-zone direction of Si (111) substrate) of the threading dislocations reaching the surface of an interface control layer when the interface control layer is formed at about 950° C. and about 1050° C., respectively. In FIGS. 7A, 7B, 8A and 8B, an arrow represents a threading dislocation. The arrows in FIGS. 7A and 8A was smaller than the arrows in FIGS. 7B and 8B. This means that the threading dislocation of an interface control layer grown at about 950° C. was smaller than the threading dislocation of an interface control layer grown at about 1050° C.

Figure 9A:
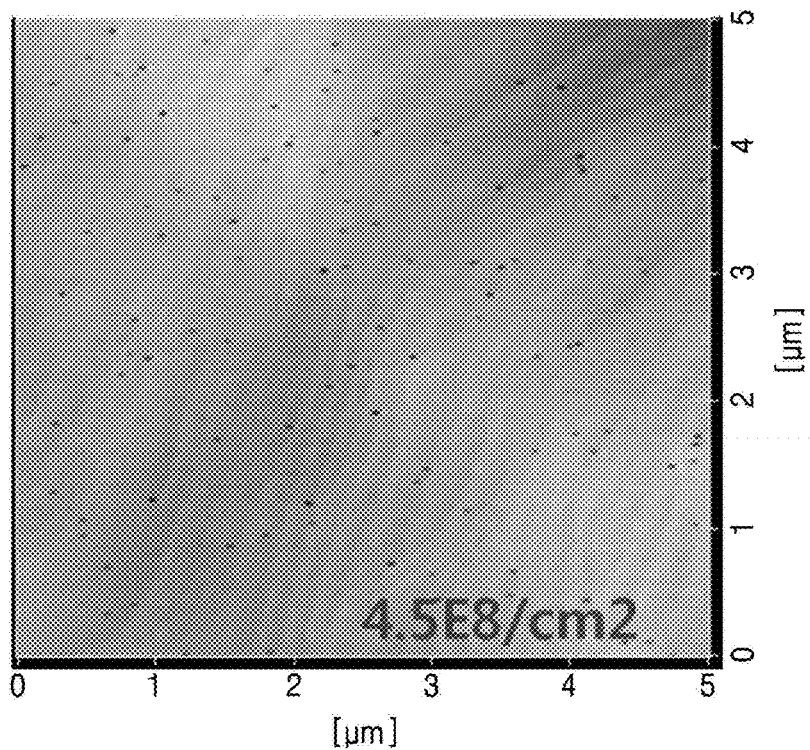
FIGS. 9A and 9B illustrate the atomic force microscope (AFM) images of the surface of the interface control layer depending on the growth temperatures of the interface control layer of a semiconductor device.
Figure 9B:
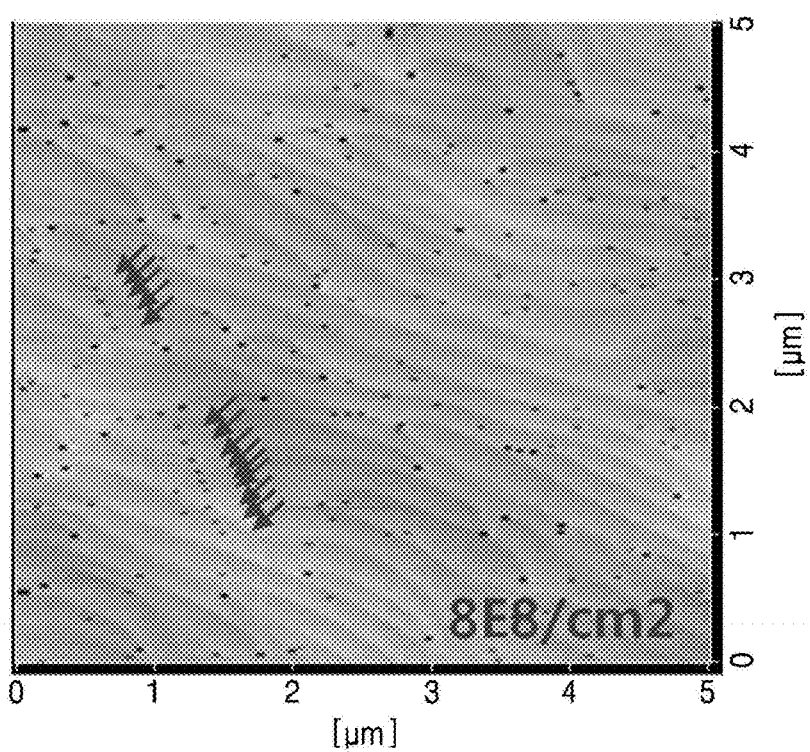

FIGS. 9A and 9B illustrate the atomic force microscope (AFM) images of the surface of the interface control layer depending on the growth temperatures of the interface control layer of a semiconductor device.

FIGS. 9A and 9B illustrate an atomic force microscope (AFM) images of the surface of the interface control layer when an interface control layer is formed at about 950° C. and about 1050° C., respectively. FIG. 9B illustrates that an edge-type dislocation generated according to meeting of a twist grain boundary at the portion represented by the arrow is arranged in a line type.

Therefore, by growing an interface control layer 120 at a temperature of, for example, about 900° C. to about 1050° C., the crystallinity may be increased and the generation of a twist grain boundary may be reduced.

Next, by controlling the thickness of the interface control layer, the crystallinity may be increased and the generation of a twist grain boundary may be reduced. As the thickness of the interface control layer 120 increases, the crystallinity may be degraded and the compressive stress may be reduced. The following represents the FWHMs of XRC when the interface control layer 120 is formed at about 950° C. to a thickness of about 160 nm, about 320 nm, and about 640 nm, respectively.

TABLE 3

| | XRC FWHM | |
|---|---|---|
| Thickness | (002) | (102) |
| 160 nm | 282" | 311" |
| 320 nm | 275" | 323" |
| 640 nm | 310" | 382" |

According to Table 3, as the thickness increases, the crystallinity was degraded and the compressive stress was reduced. Since the growth temperature of the interface control layer 120 is relatively low, the roughness may be improved but the crystallinity and the compressive stress may be degraded as the thickness increases. Therefore, the crystallinity and the compressive stress may be improved by suitably reducing the thickness, and the roughness may be improved by setting the growth temperature to be higher than about 900° C. and lower than about 1050° C. Accordingly, the twist grain boundary may be reduced. The ratio of the roughness of the interface control layer 120 to the roughness of the buffer layer 115 may be about 3 or less. In this manner, by controlling the growth condition of the interface control layer 120, the thickness of the interface control layer 120 may be reduced and the ratio of the roughness of the interface control layer 120 to the roughness of the buffer layer 115 may be reduced.

Next, the crystallinity and the compressive stress were measured while controlling the growth pressure of the interface control layer 120 and the molar composition ratio of the interface control layer 120 in (or, alternatively, during) growth. Herein, the interface control layer 120 was formed of GaN, and a simulation was made while changing the molar composition ratio (V/III) of Ga and N. Herein, V/III is the molar composition ratio between the Group V material and the Group III material used in growth of the interface control layer 120.

TABLE 4

| Growth Conditions | | | | XRC FWHM (arcsec) | |
|---|---|---|---|---|---|
| Pressure | Temperature | Material | Composition Ratio | (002) | (102) |
| 75 torr | 950° C. | GaN | V/III = 837 | 273" | 294" |
| 200 torr | 950° C. | GaN | V/III = 812 | 282" | 304" |
| 500 torr | 950° C. | GaN | V/III = 812 | 330" | 530" |
| 75 torr | 950° C. | GaN | V/III = 1674 | 280" | 300" |

According to Table 4, as the pressure decreases, the crystallinity and the compressive stress are improved; and as the V/III composition ratio increases, the crystallinity and the compressive stress are improved.

For example, the interface control layer 120 may be grown at a pressure of about 20 torr to about 500 torr. The interface control layer 120 may have a Group V/Group III molar composition ratio of about 10 to about 2,000.

Next, a nitride stack 125 is formed on the interface control layer 120. The nitride stack 125 may be formed under a different growth condition from the interface control layer 120. Therefore, the interface control layer 120 and the nitride stack 125 may be differentiated by, for example, growth characteristics. For example, the nitride stack 125 may be grown at a temperature of about 940° C. to about 1,100° C. The nitride stack 125 may be grown at a temperature of about 50 torr to about 300 torr.

The nitride stack 125 may be formed of $Al_{x4}In_{y4}Ga_{1-x4-y4}N$ (0≤x4 and y4≤1, and x4+y4<1). The nitride stack 125 may include one or more nitride semiconductor layers. When the nitride stack 125 includes a plurality of nitride semiconductor layers, the nitride semiconductor layers may be divided according to functions or composition materials. For example, the plurality of nitride semiconductor layers may be discriminated (or, alternatively, differentiated) by different composition ratios, doping/undoping, or different doping concentrations. For example, the nitride stack 125 may include an undoped GaN layer and an n-type GaN layer.

By forming the interface control layer 120 to have a small thickness according to the growth condition and a roughness ratio of about 3 or less with respect to the buffer layer 115, the nitride stack 125 on the interface control layer 120 may be grown to have a low defect density. Also, due to use of the interface control layer 120, a low threading dislocation thereof may be obtained (e.g., an interface control layer having a surface pit density of 5E8/cm² or less as measured by an AFM). Accordingly, the compressive stress relaxation due to the threading dislocation may be reduced. Therefore, the nitride stack 125 may be grown between the nitride semiconductor layers with no other layers interposed therebetween, for obtaining the crystallinity or the compressive stress. That is, the nitride semiconductor layers of the nitride stack may be sequentially formed with no other layer interposed therebetween. Herein, the nitride semiconductor layers may be formed of homogeneous materials. The homogeneous materials may indicate that the components of the nitride semiconductor layers are identical. However, a heterogeneous nitride semiconductor layer may also be interposed between the nitride semiconductor layers for obtaining other characteristics.

Also, the interface control layer may be formed directly on the buffer layer with no other layer interposed therebetween. That is, since the crystallinity and the compressive stress characteristics are obtained by the interface control layer, the interface control layer may be formed directly on the buffer layer without no other layers interposed between the buffer layer and the interface control layer.

According to the method of manufacturing a semiconductor device according to an embodiment of the present invention, it is possible to provide a semiconductor device having a thin-film structure with a low defect density and a relatively low thickness due to use of an interface control layer having low roughness. In addition, the semiconductor device fabricated by this method has a large thickness as an SiNx mask layer is used to reduce the dislocation density and the SiNx mask layer is grown to a thickness of several μm or more for coalescence during the growth of a nitride layer on the mask layer. In general, since a relative tensile stress is generated in a coalescence process, the possibility of occurrence of a crack in a thin film may be increased. However, according to an embodiment of the present invention, the total thickness of a buffer layer, an interface control layer, and a nitride stack may be, for example, about 6 μm or less even when the mask layer is not used. Also, it is possible to provide a low dislocation density that has a surface pit density of 5E8/cm2 or less measured by an AFM. Also, it is possible to provide a crystallinity that the FWHM ratio between the (002) direction and the (102) direction is about 280"/300" or less. Also, for example, an n-type GaN layer having an Si doping concentration of 4E18/cm3 may be grown without a crack of 3 μm or more. This is merely exemplary, and the present invention is not limited thereto. Thus, according to the method of manufacturing a semiconductor device according to an embodiment of the present invention, it is possible to provide a small-thickness and low-defect semiconductor device.

The semiconductor device according to an embodiment of the present invention may have good crystallinity with a small thickness and may be formed to have a large diameter, for example, about 8 inches or more.

FIGS. 10 to 15 are cross-sectional views of examples of a silicon substrate S that may be used in a semiconductor device according to embodiments of the present invention.

The silicon substrate S may be used with a crack prevention portion provided at an edge portion S1 that is vulnerable to a crack that may occur during a semiconductor thin film growth process.

Figure 10:
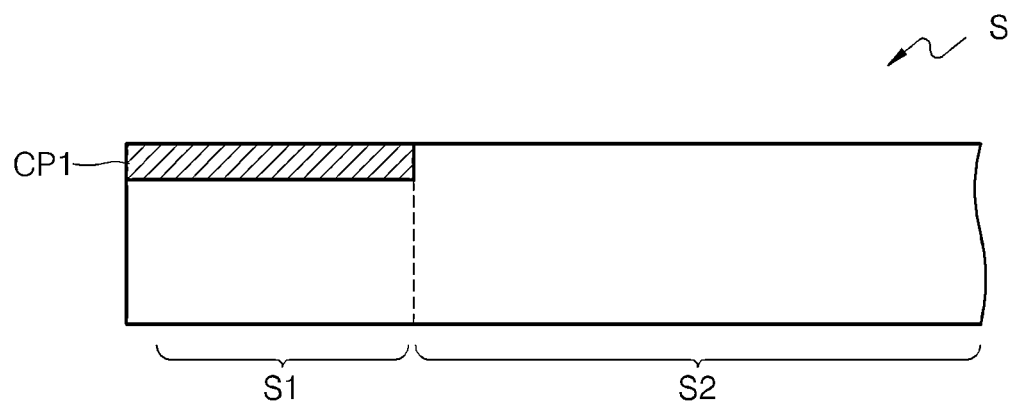
FIGS. 10 to 15 are cross-sectional views of examples of a silicon substrate used in a semiconductor device according to embodiments of the present invention.

Referring to FIG. 10, the silicon substrate S may include a main portion S2 and an edge portion S1 surrounding the main portion S2. The silicon substrate S may be, for example, circular, and the main portion S2 may be a portion of the substrate S inside the edge portion S1. The main portion S2 may be a region in which a monocrystalline nitride semiconductor thin film is to be grown. For example, the silicon substrate S may include a crack prevention portion CP1 that is formed with a random crystalline surface direction on a top surface of the edge portion S1.

For example, the main portion S2 may have a (111) crystalline surface, and the crack prevention portion CP1 may have a non-uniform crystalline surface. Since the crystalline surface direction of the crack prevention portion CP1 is non-uniform, when a nitride semiconductor thin film is formed thereon, the nitride semiconductor thin film may not grow in a monocrystalline structure and may grow in an amorphous of polycrystalline structure. On the other hand, the nitride semiconductor thin film may grow in a monocrystalline structure on the main portion S2.

In the process of growing a nitride semiconductor thin film on the silicon substrate S, when the crack prevention portion CP1 has a random crystalline surface direction or a rough surface, the crystalline direction may be oriented, for example, in the (111) direction in the main portion S2, but the crystalline direction may be oriented randomly in the crack prevention portion CP1 due to the rough surface of the crack prevention portion. Therefore, since the nitride semiconductor thin film grown on the crack prevention portion CP1 are grown in a polycrystalline or amorphous state, a stress at an interface between the substrate and the thin film caused by the growth of heterogeneous materials may be relaxed, unlike a monocrystalline portion of the nitride semiconductor thin film grown on the (111) surface of the silicon substrate. Therefore, when a nitride semiconductor thin film is grown on the edge portion S1, a stress caused by the thin film may be reduced and thus the deformation of the silicon substrate may be relaxed.

Figure 11:
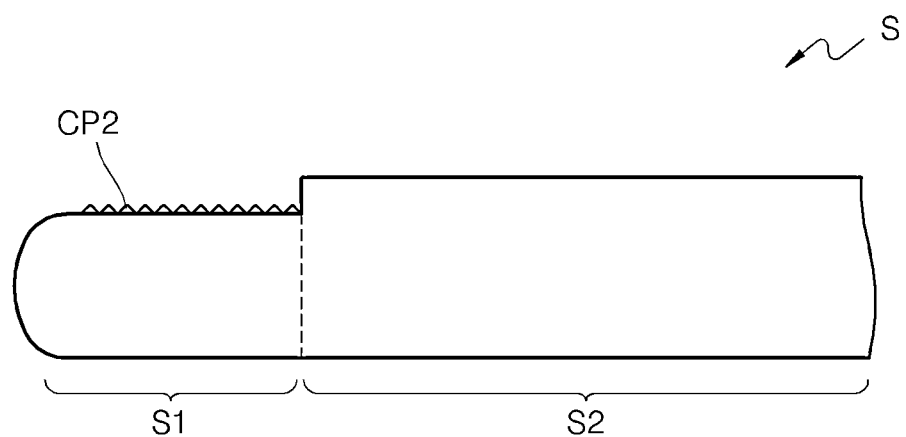

Referring to FIG. 11, the silicon substrate S may include a main portion S2 and an edge portion S1 surrounding the main portion S2, and a crack prevention portion CP2 having the shape of an uneven pattern may be formed on the edge portion S1. The uneven pattern may be formed through a general photolithography process, and due to the uneven pattern, the crack prevention portion CP2 may have a rough surface or a random crystalline surface direction.

Figure 12:
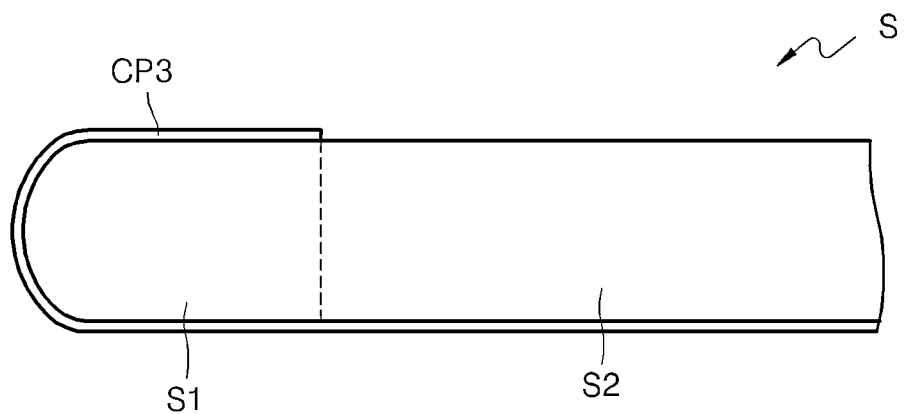

Referring to FIG. 12, the silicon substrate S may include a silicon main portion S2, a silicon edge portion S1 surrounding the silicon main portion S2, and a crack prevention portion CP3 formed on the silicon edge portion S1. For example, the crack prevention portion CP3 may be formed of a thermal oxide formed by thermal oxidation of the edge portion S1. Alternatively, the crack prevention portion CP3 may be formed of a dielectric film by depositing a dielectric material, such as an oxide or a nitride, on the silicon substrate S by sputtering or chemical vapor deposition (CVD) and patterning and etching the resulting structure through a photolithography process. Herein, the crack prevention portion CP3 may extend to the side surface or the bottom surface of the silicon substrate S in addition to the top portion of the silicon edge portion S1.

Figure 13:
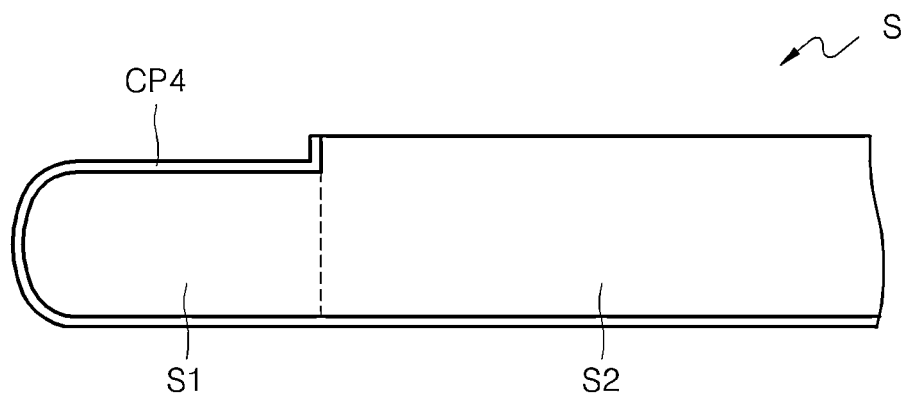

Referring to FIG. 13, in the silicon substrate S, a top portion of the edge portion S1 may be etched to form a step portion, and a crack prevention portion CP4 may be formed on the edge portion S1 stepped lower than the main portion S2 of the silicon substrate S.

Figure 14:
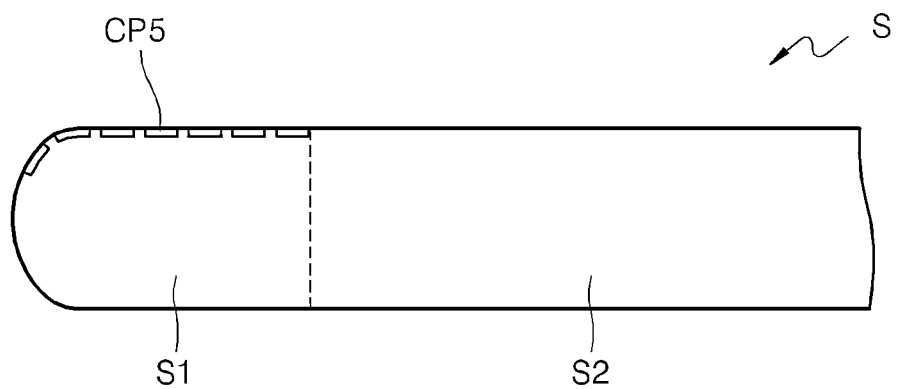

Referring to FIG. 14, the silicon substrate S may include a main portion S2, an edge portion S1 surrounding the main portion S2, and a crack prevention portion CP5 formed on the edge portion S1. The crack prevention portion CP5 may be formed on the edge portion S1 by ion implantation. By the ion implantation, the surface of the edge portion S1 may be changed into a polycrystalline or amorphous state. FIG. 14 illustrates that ion implantation is performed only on the top surface of the edge portion S1. However, the inventive concept is not limited thereto. That is, ion implantation may also be performed on the side surface and the bottom surface of the edge portion S1 and the bottom surface of the main portion S2, in addition to the top surface of the edge portion S1. For example, when the crack prevention portion CP5 extends up to the side surface of the edge portion S1, a crack reduction effect may be increased by relaxing an impact due to high-speed rotation when the silicon substrate S is rotated at a high speed in a deposition apparatus.

Figure 15:
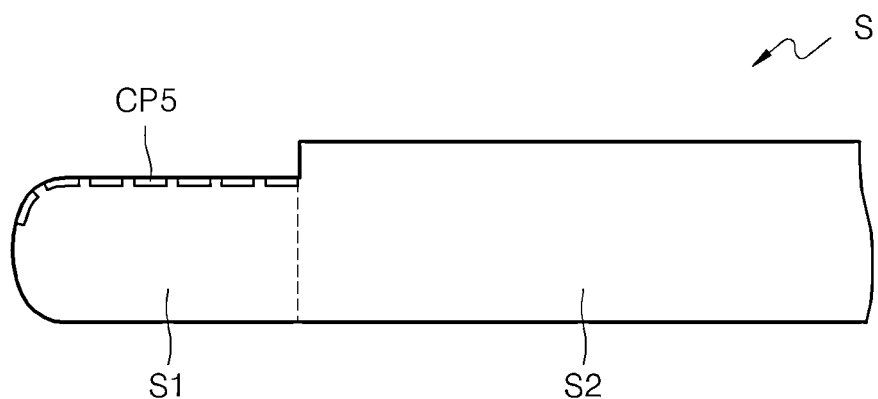

Referring to FIG. 15, in the silicon substrate S, a top portion of the edge portion S1 may be etched to form a step portion, and a crack prevention portion CP5 may be formed by ion implantation on the edge portion S1 stepped lower than the main portion S2 of the silicon substrate S.

The silicon substrates S illustrated in FIGS. 10 to 15 may be doped at a predetermined doping concentration to reduce a bow that occurs during a semiconductor thin film manufacturing process.

A buffer layer used in the semiconductor device according an embodiment of the present invention will be described below.

The buffer layer may include a single layer or a compound layer. Layers constituting the single layer or the compound layer may have a uniform composition and may have a variable composition. For example, when the composition is changed, the Al composition may be reduced toward the nitride stack.

Figure 16:
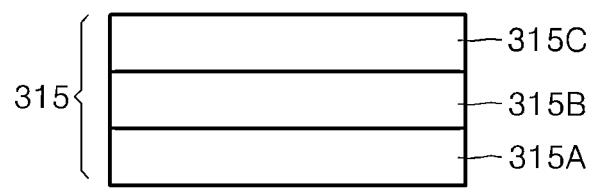
FIG. 16 illustrates an example of a buffer layer used in a semiconductor device according to embodiments of the present invention.

When the compound layer is used as the buffer layer, a superlattice layer may be used and a superlattice layer may be used partially. For example, as illustrated in FIG. 16, a buffer layer 315 may include a first layer 315A, a second layer 315B, and a third layer 315C.

The first layer 315A may include $Al_xIn_yGa_{1-x-y}N$ ($0 \le x \le 1$, $0 \le y \le 1$, $0 \le x+y \le 1$) and have a lattice constant LP1 that is smaller than a lattice constant LP0 of the substrates 110 and 210 (see FIGS. 1 to 3). The second layer 315B may be formed on the first layer 315A, include $Al_xIn_yGa_{1-x-y}N$ ($0 \le x < 1$, $0 \le y < 1$, $0 \le x+y < 1$), and have a lattice constant LP2 that is greater than LP1 and is smaller than LP0. The third layer 315C may be formed on the second layer 315B, include $Al_xIn_yGa_{1-x-y}N$ ($0 \le x < 1$, $0 \le y < 1$, $0 \le x+y < 1$), and have a lattice constant LP3 that is smaller than LP2. LP3 may be greater than LP1.

The first layer 315A may have a lattice constant that is smaller than the lattice constant of the substrate, and thus, may undergo tensile stress. The second layer 315B may have a lattice constant that is greater than the lattice constant of the first layer 315A, and thus, may undergo compressive stress due to the first layer 121. The third layer 315C may have a lattice constant that is smaller than the lattice constant of the second layer 315B, and thus, may undergo tensile stress due to the second layer 315B. The types and strengths of stress applied to layers may vary according to a relationship between layer thicknesses and lattice relaxation in addition to a lattice constant difference with a lower layer. For example, since the second layer 315B, which undergoes compressive stress caused by the first layer 315A having lattice relaxation on a silicon substrate, is very thin, lattice relaxation does not occur. When the second layer 315B is grown coherently with a lattice of the first layer 315A, that is, when the lattice size of a lattice of the second layer 315B is grown nearly similarly to the lattice size of the first layer 315A, the type and strength of stress undergone by the third layer 315C depends on the lattice size of the first layer 315A. According to this relation, for example, when the first layer 315A or the third layer 315B is a layer that undergoes tensile stress due to the substrate and the second layer 315B, if the tensile stress is excessive, cracks may occur. Thus, the first layer 315A or the third layer 315C may be configured to have a thickness that is equal to or smaller than a critical thickness at which cracks occur during growth or cooling of the first layer 315A or the third layer 315C.

In addition, the first layer 315A may be configured to directly contact the substrate and may be formed of AlN.

Also, the first layer 315A may undergo tensile stress due to the silicon substrate S and may have lattice relaxation.

Also, thicknesses and lattice constants of layers included in the buffer layer 315 may be determined such that the sum of stresses of the layers included in the buffer layer 315 may be compressive stress, that is, such that compressive stress may be applied to a target layer formed on the buffer layer 315.

FIGS. 17A to 17D illustrate examples of individual layers included in the buffer layer.

Figure 17A:
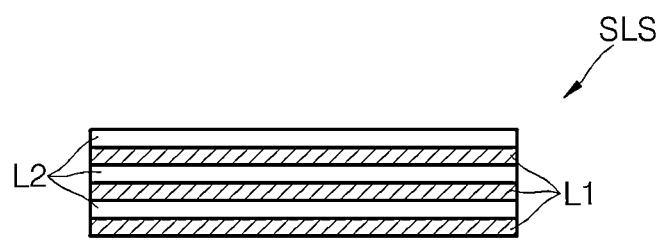
FIGS. 17A to 17D illustrate examples of individual layers used in the buffer layer of FIG. 16 according to embodiments of the present invention.
Figure 17B:
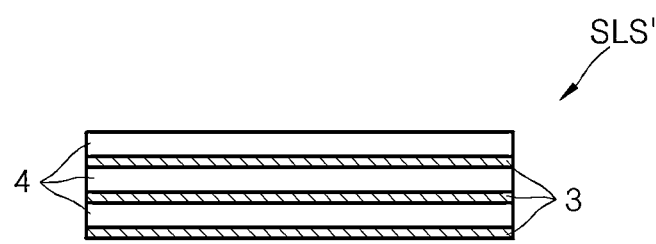

FIGS. 17A and 17B illustrate examples of superlattice layers SLS and SLS' that are used in at least one of a plurality of layers included in the buffer layer.

The superlattice layer SLS of FIG. 17A is a structure for obtaining a corresponding lattice constant, that is, a structure that satisfies a lattice constant condition of at least one of a plurality of layers included in the buffer layer and is obtained by alternately stacking two layers L1 and L2 having different lattice constants. The two layers L1 and L2 having different lattice constants may have the same thickness. The two layers L1 and L2 may include $Al_xIn_yGa_{1-x-y}N$ ($0 \leq x \leq 1$, $0 \leq y \leq 1$, $0 \leq x+y \leq 1$) and 'x' and 'y' in the two layers L1 and L2 may be determined according to a required lattice constant.

The superlattice layer SLS' of FIG. 17B is a structure for obtaining a corresponding lattice constant, that is, a structure that satisfies a lattice constant condition of at least one of a plurality of layers included in the buffer layer and is obtained by alternately stacking two layers L3 and L4 having different lattice constants. The two layers L3 and L4 having different lattice constants may have different thicknesses. The two layers L3 and L4 may include $Al_xIn_yGa_{1-x-y}N$ ($0 \leq x \leq 1$, $0 \leq y \leq 1$, $0 \leq x+y \leq 1$) and 'x' and 'y' in the two layers L1 and L2 may be determined according to a required lattice constant.

Figure 17C:
Figure 17D:

FIGS. 17C and 17D show a case where a required lattice constant, that is, a lattice constant condition for any one of a plurality of layers included in the buffer layer is obtained by a single layer. In this case, the single layer refers to a single layer in which no physical boundary exists but does not mean that material composition therein is constant.

The single layer SL of FIG. 17C may have a lattice constant that does not vary in a thickness direction of the single layer SL. The single layer SL' of FIG. 17D may have a lattice constant that varies in a thickness direction of the single layer SL'.

Herein, the buffer layer may include one or more layers that are configured as described above.

Figure 18:
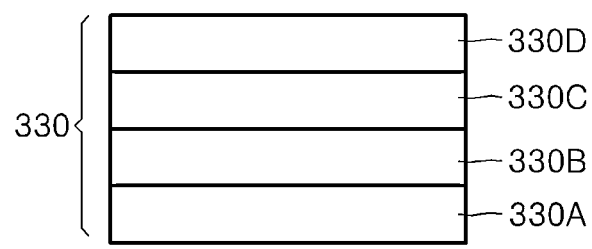
FIG. 18 is a cross-sectional view of another example of a buffer layer used in a semiconductor device according to embodiments of the present invention.

FIG. 18 is a cross-sectional view of another example of a buffer layer structure.

A buffer layer 330 of FIG. 18 may include a first layer 330A, a second layer 330B, and a third layer 330C, which are substantially the same as the first layer 315A, the second layer 315B, and the third layer 315C of FIG. 16, respectively, and may further include a fourth layer 330D that is formed on the third layer 330C, includes $Al_xIn_yGa_{1-x-y}N$ ($0 \leq x < 1$, $0 \leq y < 1$, $0 \leq x+y < 1$), and has a lattice constant LP4 that is greater than a lattice constant LP2.

Figure 19:
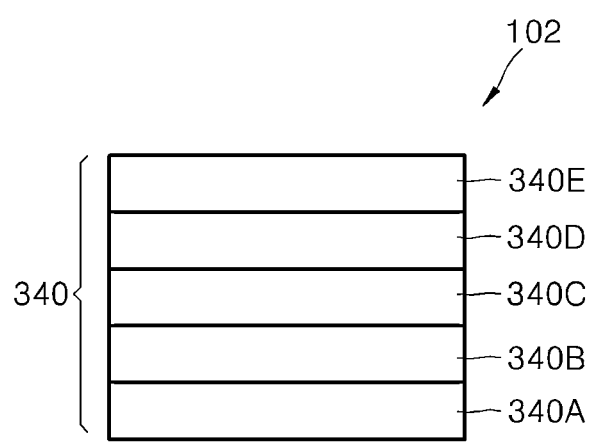
FIG. 19 is a cross-sectional view of another example of a buffer layer used in a semiconductor device according to another embodiment of the present invention.

FIG. 19 is a schematic cross-sectional view of another example of a buffer layer.

A buffer layer 340 of FIG. 19 may include a first layer 340A, a second layer 340B, and a third layer 340C, which are substantially the same as the first layer 315A, the second layer 315B, and the third layer 315C of FIG. 16, respectively, and may further include a fourth layer 340D that is formed on the third layer 340C, includes $Al_xIn_yGa_{1-x-y}N$ ($0 \leq x < 1$, $0 \leq y < 1$, $0 \leq x+y < 1$), and has a lattice constant LP4 that is greater than the lattice constant LP2, and a fifth layer 340E that is formed on the fourth layer 340D, includes AlxInyGa1-x-yN ($0 \leq x < 1$, $0 \leq y < 1$, $0 \leq x+y < 1$), and has a lattice constant LP5 that is greater than a lattice constant LP5 that is greater than the lattice constant LP3 and smaller than the lattice constant LP4.

Figure 20:
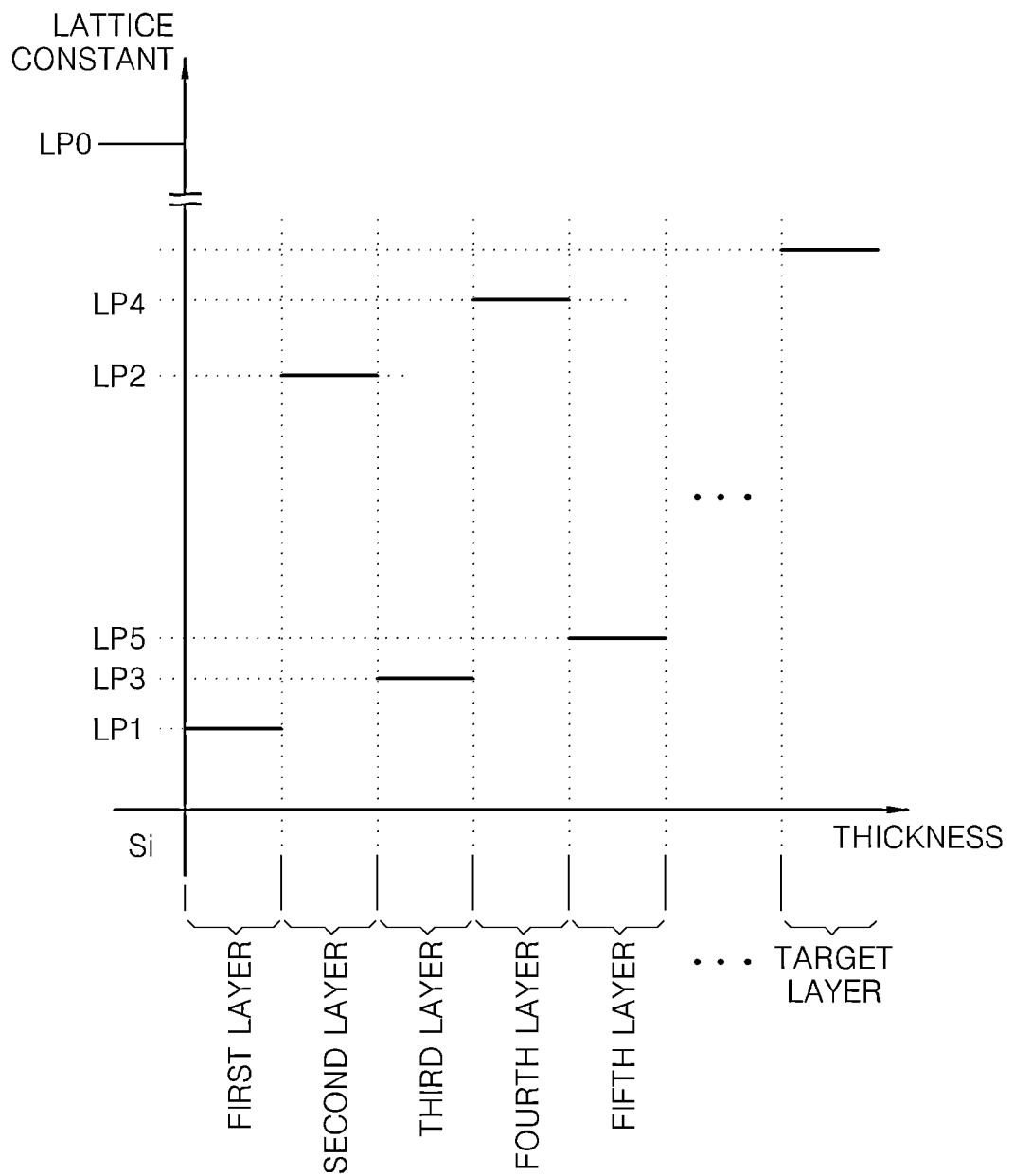
FIG. 20 is a graph illustrating a lattice constant relationship between layers included in the buffer layer of FIG. 16, 18, or 19.

FIG. 20 is a graph illustrating a lattice constant relationship between layers included in the buffer layer 315, 330, or 340 of FIG. 16, 18, or 19.

The buffer layer 315, 330, or 340 may include a plurality of layers that satisfy the lattice constant relationship shown in FIG. 20 and may include five layers or less, or five layers or more. The uppermost layer of the buffer layer 120, 130, or 140 may have a lattice constant that is smaller than that of a desired target layer, for example, a nitride semiconductor layer.

Figure 21:
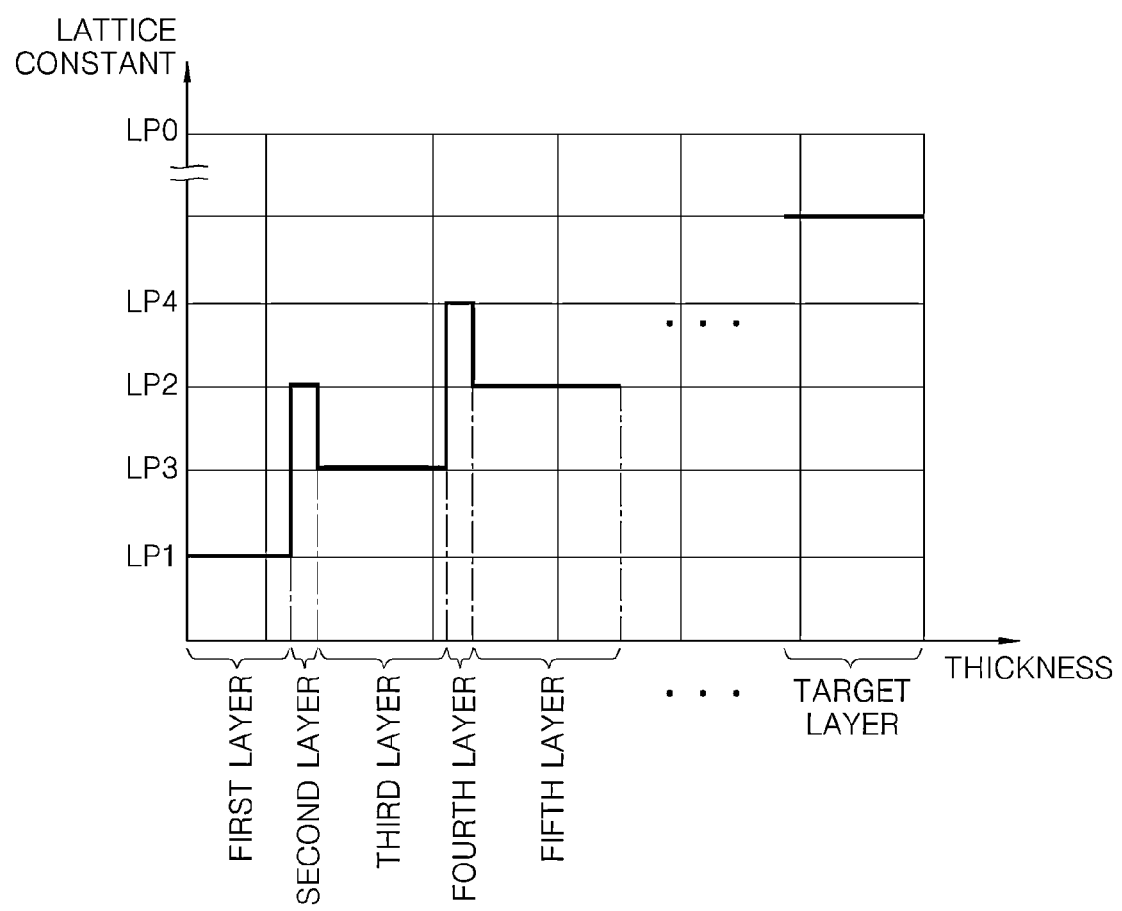
FIG. 21 is a graph illustrating combinations of thicknesses and lattice constants of layers included in the buffer layer of FIG. 16, 18, or 19.
Figure 22:
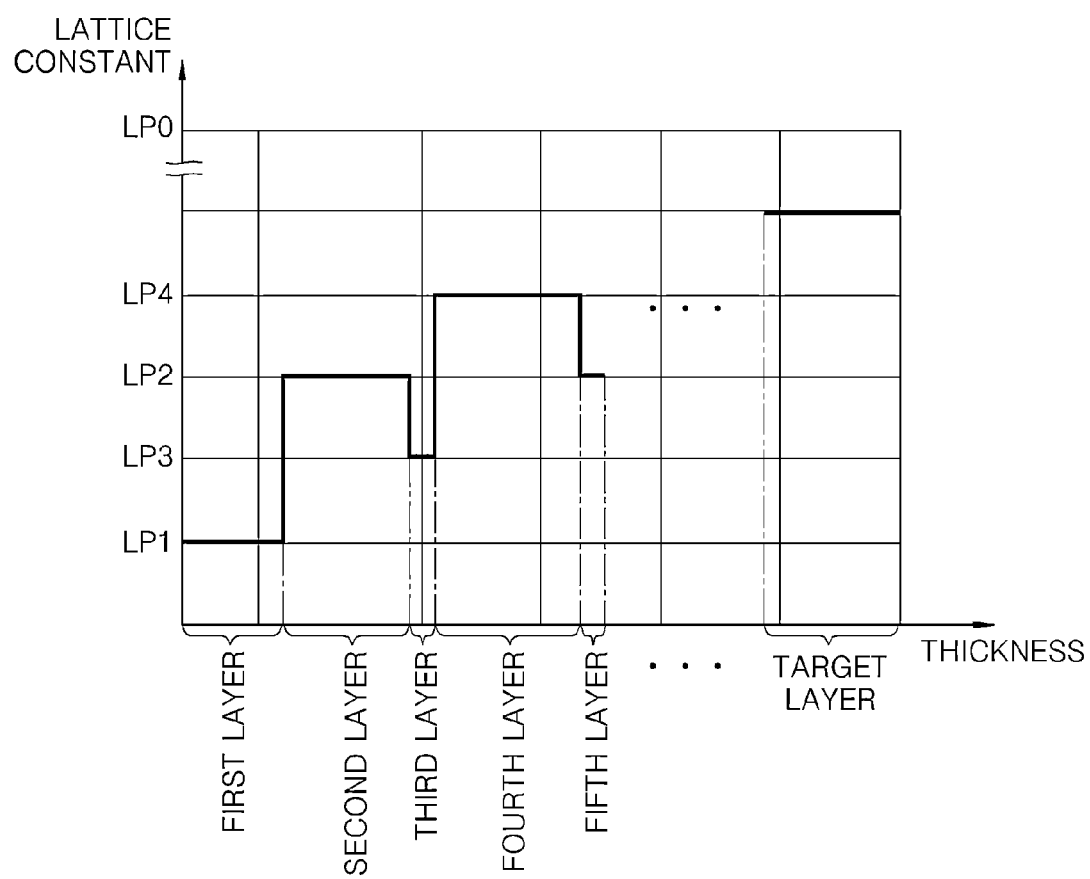
FIG. 22 is a graph illustrating another example of combinations of thicknesses and lattice constants of layers included in the buffer layer of FIG. 16, 18, or 19.

FIGS. 21 and 22 are graphs illustrating combinations of thicknesses and lattice constants of layers included in the buffer layer 315, 330, or 340 of FIG. 16, 18, or 19.

Referring to FIG. 21, a second layer and a fourth layer may have the same thickness, a third layer and a fifth layer may have the same thickness, and the thickness of the third layer may be greater than the thickness of the second layer. Under this thickness distribution, tensile stress is not applied to the third layer and the fifth layer, which have smaller lattice constants than their lower layers. The thickness of a lower layer having a great lattice constant, that is, the second layer or the fourth layer may be small such that lattice relaxation little occurs and thus tensile stress is not applied to an upper layer having a small lattice constant, that is, the third layer or the fourth layer. In this case, since the upper layer having a small lattice constant is not likely to crack due to tensile stress, the thickness of an upper layer may be greater than a lower layer.

Referring to FIG. 22, the second layer and the fourth layer may have the same thickness, the third layer and the fifth layer may the same thickness, and the thickness of the third layer may be smaller than the thickness of the second layer. Under this thickness distribution, a lower layer having a great lattice constant may have a thickness such that tensile stress is applied to an upper layer having a small lattice constant. The third layer and the fifth layer, which undergo tensile stress, may each have a small thickness so as not to crack during growth or cooling of the third layer and the fifth layer in a manufacturing process.

The examples of FIGS. 21 and 22 show that the type and strength of stress applied to each layer may vary according to thickness and lattice relaxation in addition to a difference in lattice constants determined by compositions.

The semiconductor device according to an embodiment of the present invention may be used as a template for a light-emitting diode (LED), a Schottky diode, a laser diode (LD), a field effect transistor (FET) or a high electron mobility transistor (HEMT).

Figure 23:
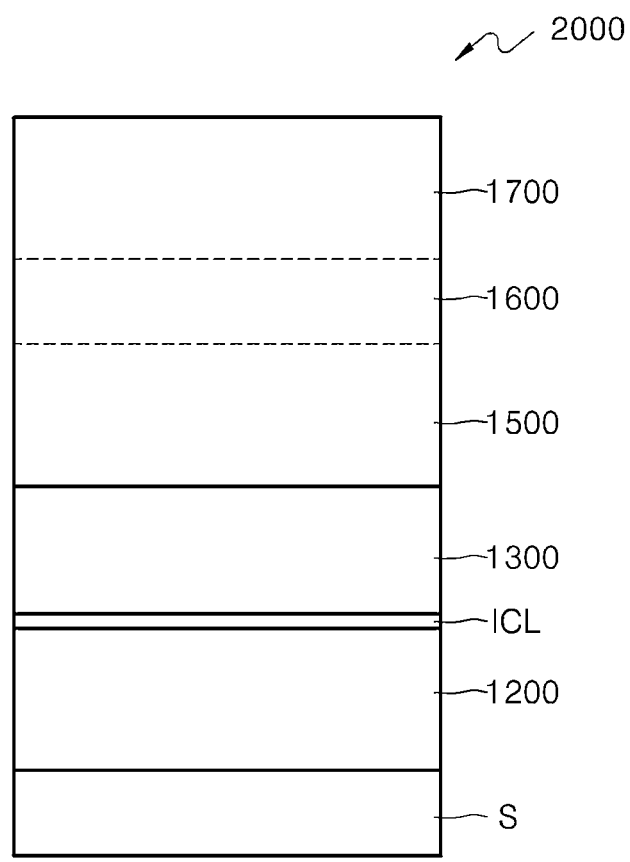
FIG. 23 is a schematic cross-sectional view of a semiconductor device according to another embodiment of the present invention.

FIG. 23 is a schematic cross-sectional view of a semiconductor device 2000 according to another embodiment of the present invention.

The semiconductor device 2000 according to an embodiment of the present invention includes a silicon substrate S, a buffer layer 1200 formed on the silicon substrate S, an interface control layer ICL formed on the buffer layer 1200, a nitride semiconductor layer 1300 formed on the interface control layer ICL, and a device layer formed on the nitride semiconductor layer 1300. Since the silicon substrate S, the buffer layer 1200, the interface control layer ICL, and the nitride semiconductor layer 1300 are substantially the same as described above, detailed descriptions thereof will be omitted herein.

The device layer may include a first-type semiconductor layer 1500, an active layer 1600, and a second-type semiconductor layer 1700.

The first-type semiconductor layer 1500 is a semiconductor layer doped in a first type. The first-type semiconductor layer 1500 may be formed of Group III-V nitride semiconductor materials. For example, the first-type semiconductor layer 1500 may be formed of a semiconductor material $Al_xGa_yIn_zN$ ($0 \leq x \leq 1$, $0 \leq y \leq 1$, $0 \leq z \leq 1$, $x+y+z=1$) doped with an n-type dopant. Examples of the n-type dopant may include Si, Ge, Se, and Te.

The second-type semiconductor layer 1700 is a semiconductor layer doped in a second type. The second-type semiconductor layer 1700 may be formed of Group III-V nitride semiconductor materials. For example, the second-type semiconductor layer 1700 may be formed of a semiconductor material $Al_xGa_yIn_zN$ ($0 \le x \le 1$, $0 \le y \le 1$, $0 \le z \le 1$, $x+y+z=1$) doped with a p-type dopant. Examples of the p-type dopant may include Mg, Zn, and Be.

The active layer 1600 emits light by electron-hole recombination. Energy corresponding to the energy band gap of the active layer 1600 may be emitted in the form of light. The active layer 1600 may include a structure of a single quantum well generated by controlling a band gap by periodically changing x, y, z values in $Al_xGa_yIn_zN$, or a multi quantum well. For example, a quantum well structure may be formed by paring a quantum well layer and a barrier layer in the form of InGaN/GaN, InGaN/InGaN, InGaN/AlGaN, or InGaN/InAlGaN, and a light-emitting wavelength band may be controlled by controlling a band-gap energy according to an In mole ratio in an InGaN layer. In general, when the In mole ratio changes by about 1%, the light-emitting wavelength shifts by about 5 nm.

The first-type semiconductor layer 1500 and the second-type semiconductor layer 1700 are illustrated as having a single-layer structure; however, the first-type semiconductor layer 1500 and the second-type semiconductor layer 1700 may have a multi-layer structure.

The first-type semiconductor layer 1500 is illustrated as being formed on the nitride semiconductor layer 1300; however, the first-type semiconductor layer 1500 may also be formed by doping the nitride semiconductor layer 1300 with a first-type dopant.

The device layer has been described as including an LED structure; however, the device layer may also include a laser diode (LD) structure, a field-effect transistor (FED) structure, a high electron mobility transistor (HEMT) structure, or a Schottky diode structure.

Figure 24:
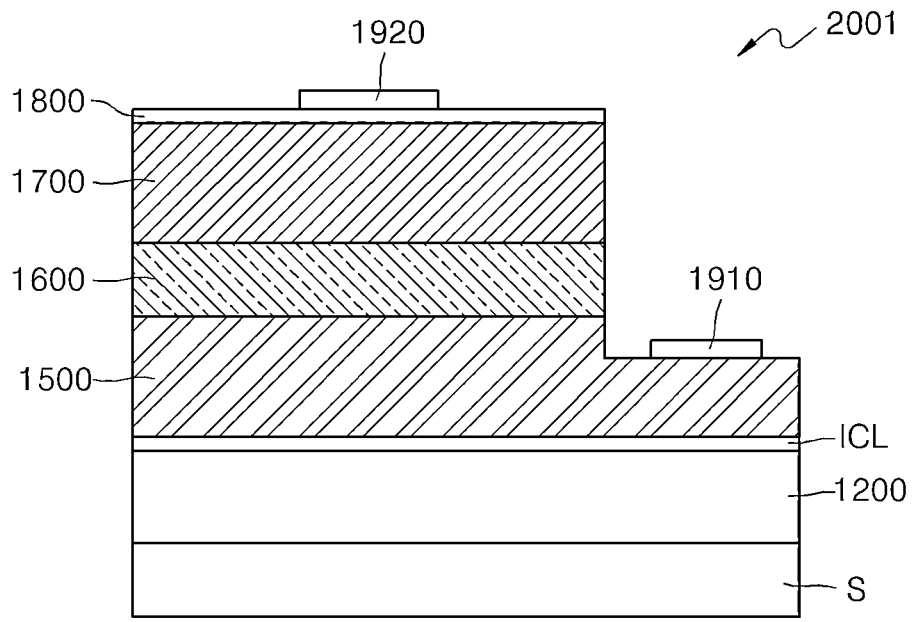
FIGS. 24 to 27 are cross-sectional views of examples of a light-emitting device as a semiconductor device according to another embodiment of the present invention.
Figure 25:
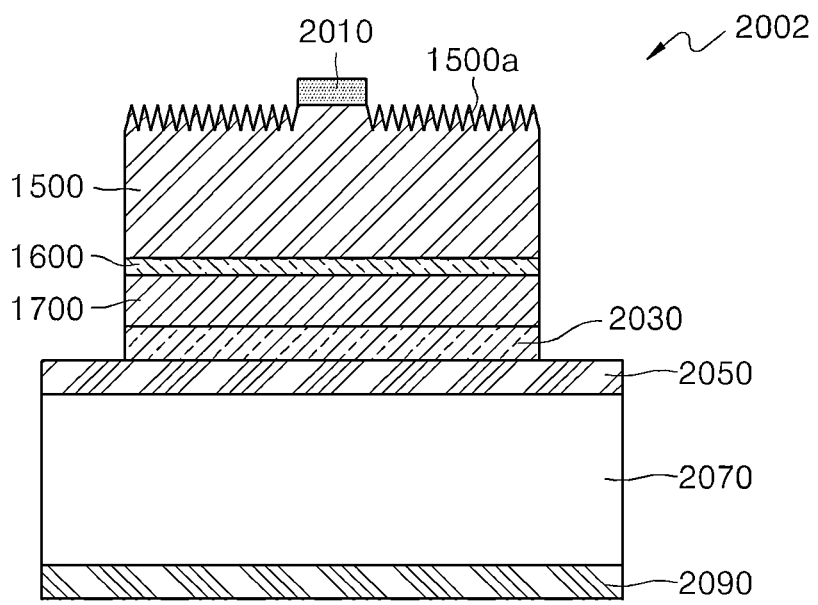
Figure 26:
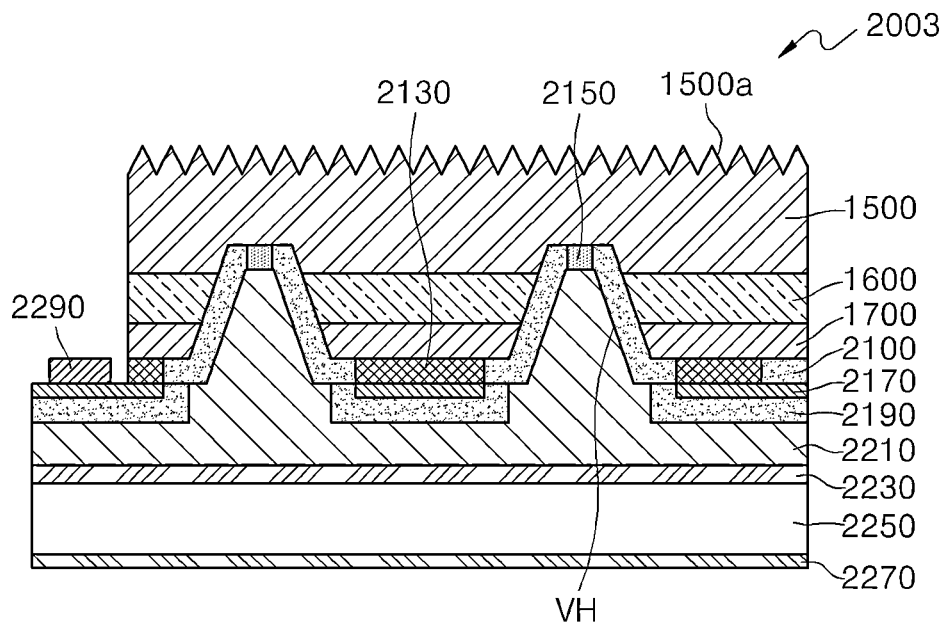
Figure 27:
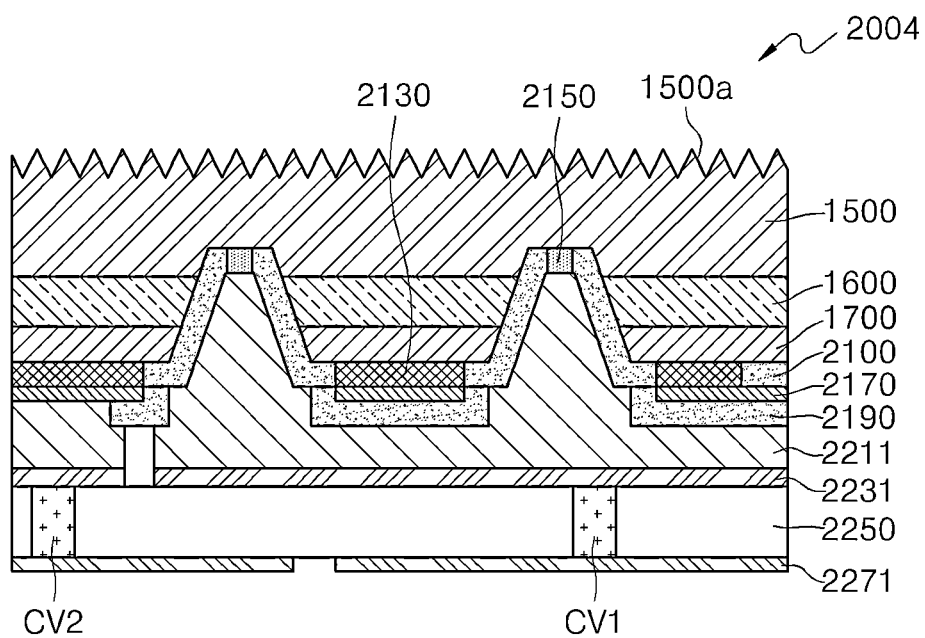

A semiconductor device 2001 of FIG. 24 may include various electrode structures for injecting a current to recombine electrons and holes in the active layer 1600, examples of which are illustrated in FIGS. 25 to 27.

FIGS. 24 to 27 are cross-sectional views of various examples of a light-emitting device as a semiconductor device according to an embodiment of the present invention.

Referring to FIG. 24, in the light-emitting device 2001, a first electrode 191 is formed on a portion of a first-type semiconductor layer 1500, which is exposed by etching predetermined regions of a second-type semiconductor layer 1700, an active layer 1600, and the first-type semiconductor layer 1500, and a second electrode 192 is formed on the second-type semiconductor layer 1700. Also, a transparent electrode layer 1800 may be formed between the second-type semiconductor layer 1700 and the second electrode 1920.

This type of chip structure is referred to as an epi-up structure.

The first electrode 1910 and the second electrode 1920 may be formed of any one or any alloy of metals such as Ag, Al, Ni, Cr, Pd, Cu, Pt, Sn, W, Au, Rh, Ir, Ru, Mg, and Zn. The first electrode 1910 and the second electrode 1920 may be formed in at least two-layered structures such as Ni/Ag, Zn/Ag, Ni/Al, Zn/Al, Pd/Ag, Pd/Al, Ir/Ag, Ir/Au, Pt/Ag, Pt/Al, and Ni/Ag/Pt.

The transparent electrode layer 1800 may be formed of a transparent conductive oxide (TCO). For example, the transparent electrode layer 1800 may be formed of ITO(ITO(Indium Tin Oxide), IZO(Indium Zinc Oxide), AZO(Aluminum Zinc Oxide), ZnO, GZO(ZnO:Ga), $In_2O_3$, $SnO_2$, CdO, $CdSnO_4$, $Ga_2O_3$.

FIG. 25 is a schematic cross-sectional view of a vertical light-emitting device 2002 as a semiconductor device according to another embodiment of the present invention.

In the light-emitting device 2002, a silicon substrate S and a buffer layer 1200 used in epitaxial growth are removed, and a support substrate 2070 may be provided at the side of a second-type semiconductor layer 1700.

In order to increase a light extraction efficiency, a top surface of a first-type semiconductor layer 1500, which is exposed by removing the silicon substrate S, a nucleus growth layer 120, the buffer layer 120, and the interface control layer ICL, may be textured to include an uneven surface 1500a having an uneven pattern. The uneven pattern is not limited to the illustrated shape, but may have various periods, heights and shapes and may also be formed in irregular patterns.

In FIG. 25, all of the silicon substrate S, the buffer layer 1200, and the interface control layer ICL are removed. However, at least a portion of the buffer layer 1200 and the interface control layer ICL may be left on the first-type semiconductor layer 1500, and may be textured together with the first-type semiconductor layer 1500 to form an uneven surface 1500a.

A first electrode 2010 may be formed on the first-type semiconductor layer 1500, a second electrode 2030 may be formed on a bottom surface of the second-type semiconductor layer 1700, and a bonding metal layer 2050 may be provided between the second electrode 2030 and the support substrate 2070. For example, the bonding metal layer 2050 may include Au/Sn. The support substrate 2070 may be a Si substrate or a SiAl substrate. A back metal layer 2090 may be formed on a bottom surface of the support substrate 2070.

FIG. 26 is a schematic cross-sectional view of a vertical/horizontal light-emitting device 2003 as a semiconductor device according to another embodiment of the present invention.

In the light-emitting device 2003, a silicon substrate S, a buffer layer 1200, and an interface control layer ICL used in epitaxial growth are removed, and a support substrate 2250 may be provided at the side of a second-type semiconductor layer 1700.

In order to increase a light extraction efficiency, a top surface of a first-type semiconductor layer 1500, which is exposed by removing the silicon substrate S, the buffer layer 1200, and the interface control layer ICL, may be textured to include an uneven surface 1500a. In FIG. 26, all of the silicon substrate S, the buffer layer 1200, and the interface control layer ICL are removed. However, at least a portion of the buffer layer 1200 and the interface control layer ICL may be left on the first-type semiconductor layer 1500, and may be textured together with the first-type semiconductor layer 1500.

In order to form a first electrode 2150 contacting the first-type semiconductor layer 1500, a plurality of via-holes are formed to penetrate the first-type semiconductor layer 1500 and an active layer 1600, and a second electrode 2130 is formed on the second-type semiconductor layer 1700. A metal layer 2170 for connection with an electrode pad 2290 is formed on the second electrode 2130. A first passivation layer 2100 is formed to cover side surfaces of the via-holes and a portion of the top surface of the second-type semiconductor layer 1700, and a second passivation layer 2190 is formed to cover the metal layer 2170. A barrier metal layer 2210 is formed to connect with the first electrode 2150 and fill the via-holes.

A bonding metal layer 2230 may be formed on a top surface of the support substrate 2250, and a back metal layer 2270 may be formed on a bottom surface of the support substrate 2250.

FIG. 27 is a schematic cross-sectional view of a flip-chip type light-emitting device 2004 as a semiconductor device according to another embodiment of the present invention.

The light-emitting device 2004 according to an embodiment of the present invention is different from the light-emitting device 2003 of FIG. 25 in that both a first electrode 2150 and a second electrode 2130 are electrically exposed downward.

That is, a second passivation layer 2190 is patterned to expose a portion of a metal layer 2130 contacting the first electrode 2150. Also, a barrier metal layer 2211 is patterned to be electrically divided into two portions, such that a portion thereof contacts the first electrode 2150 and the other portion contacts the second electrode 2130.

A support substrate 2250 may be a non-conductive substrate in which a first conductive via CV1 and a second conductive via CV2 are formed. A bonding metal layer 2231 on the support substrate 2250 and a back metal layer 2271 under the support substrate 2250 are each patterned to have two regions that are electrically divided from each other. One region of the bonding metal layer 2231 and one region of the back metal layer 2271 may be electrically connected to each other by the first conductive via CV1, and the other region of the bonding metal layer 2231 and the other region of the back metal layer 2271 may be electrically connected to each other by the second conductive via CV2, such that the first electrode 2150 and the second electrode 2130 may be exposed to the outside.

A non-conductive substrate in which conductive vias are formed has been described as the support substrate 2250. However, the inventive concept is not limited thereto. That is, the support substrate 2250 may also be a conductive substrate in which insulating vias are formed.

Figure 28:
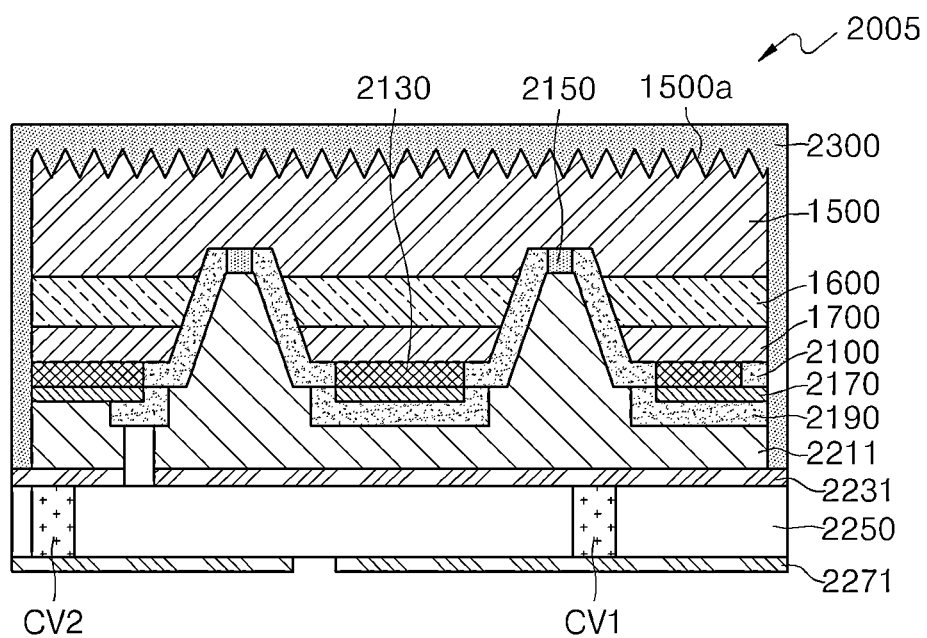
FIG. 28 is a cross-sectional view of an example of a light-emitting device package as a semiconductor device according to another embodiment of the present invention.

FIG. 28 is a cross-sectional view of an example of a light-emitting device 2005, which emits white light, as a semiconductor device according to another embodiment of the present invention.

The light-emitting device 2005 may be formed by coating the semiconductor device 2004 of FIG. 27 with a wavelength conversion layer 2300.

The wavelength conversion layer 2300 converts the wavelength of light emitted from the active layer 1600, and may have a wavelength conversion material such as a fluorescent substance or a quantum dot. When the wavelength conversion material is a fluorescent substance and blue light is emitted from the active layer 1600, the wavelength conversion layer 2300 may use a nitride-based fluorescent substance of MAlSiNx:Re($1 \leq x \leq 5$) and a sulfide-based fluorescent substance of MD:Re as a red fluorescent substance. Herein, M is at least one selected from the group consisting of Ba, Sr, Ca, and Mg; D is at least one selected from the group consisting of S, Se, and Te; and Re is at least one selected from the group consisting of Eu, Y, La, Ce, Nd, Pm, Sm, Gd, Tb, Dy, Ho, Er, Tm, Yb, Lu, F, Cl, Br, and I. Also, examples of a green fluorescent substance includes a silicate-based fluorescent substance of $M_2SiO_4$:Re, a sulfide-based fluorescent substance of $MA_2D_4$:Re, a fluorescent substance of β-SiAlON:Re, and an oxide-based fluorescent substance of $MA'_2O_4$:Re'. Herein, M is at least one selected from the group consisting of Ba, Sr, Ca, and Mg; A is at least one selected from the group consisting of Ga, Al, and In; D is at least one selected from the group consisting of S, Se, and Te; A' is at least one selected from the group consisting of Sc, Y, Gd, La, Lu, Al, and In; Re is at least one selected from the group consisting of Eu, Y, La, Ce, Nd, Pm, Sm, Gd, Tb, Dy, Ho, Er, Tm, Yb, Lu, F, Cl, Br, and I; and Re' is at least one selected from the group consisting of Ce, Nd, Pm, Sm, Tb, Dy, Ho, Er, Tm, Yb, F, Cl, Br, and I.

Also, the wavelength conversion material may be a quantum dot. The quantum dot is a nanocrystal particle including a core and a shell, wherein the size of the core ranges from about 2 nm to about 100 nm. By controlling the size of the core, the quantum dot may be used as fluorescent materials emitting various colors such as blue (B), yellow (Y), green (G), and red (R). In this case, an organic ligand using a material such as an oleic acid may be formed at the shell of the quantum dot to terminate molecular binding at the shell surface, suppress cohesion of the quantum dot, improve dispersibility in resin such as silicon resin or epoxy resin, and improve a function of a fluorescent substance.

The wavelength conversion layer 2300 is illustrated as covering the entire light-emitting structure including the first-type semiconductor layer 1500, the active layer 1600, and the second-type semiconductor layer 1700, that is, both the upper portion and the side portion. However, this is merely exemplary, and the wavelength conversion layer 2300 may be formed only on the first-type semiconductor layer 1500.

Figure 29:
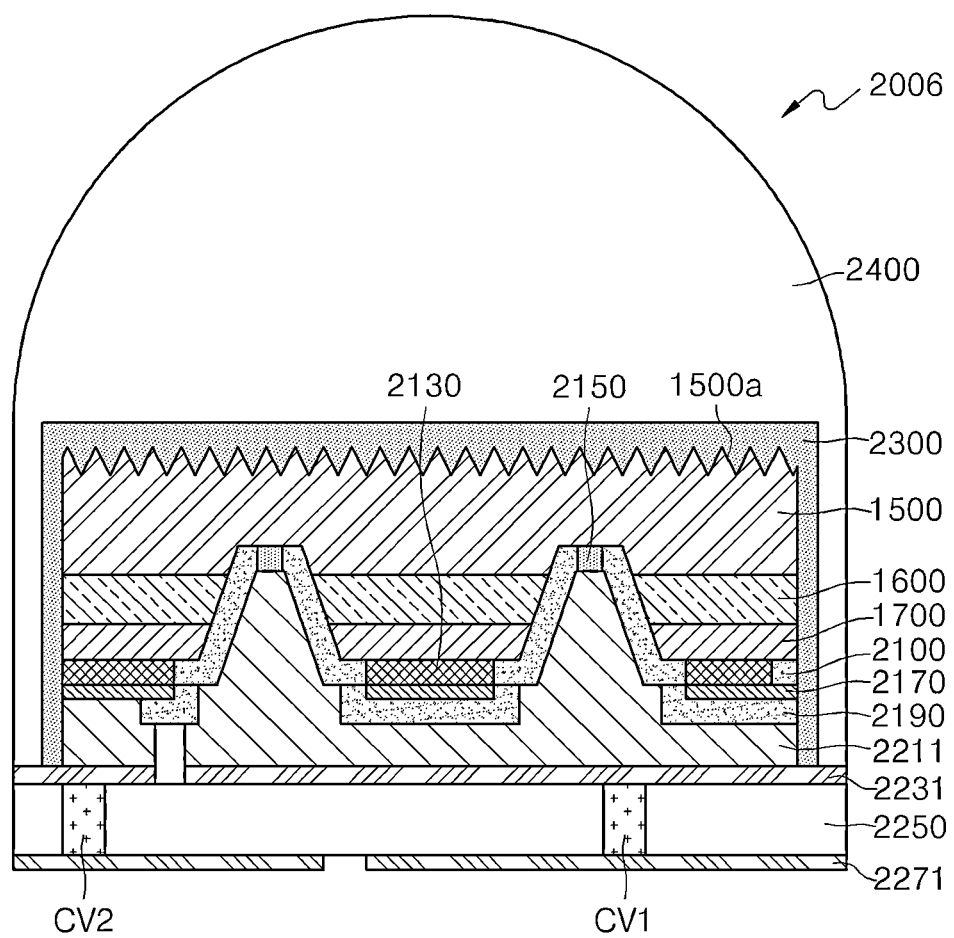
FIG. 29 is an exploded perspective view of an example of an illumination device using a light-emitting device package according to an embodiment of the present invention.

FIG. 29 is a cross-sectional view of an example of a light-emitting device package 2006 as a semiconductor device according to another embodiment of the present invention.

The light-emitting device package 2006 may further include a lens 2400 formed on the light-emitting device 2005 of FIG. 28. The lens 2400 may function as a passivation layer for a light-emitting structure, and may also control the viewing angle of light emitted from the light-emitting structure. The lens 2400 may be formed in a separate chip, or may be formed at a wafer level and diced together with the support substrate 2250. The lens 2400 is illustrated as covering both the upper portion and the side portion of the light-emitting device. However, this is merely exemplary, and the lens 2400 may be disposed only at the upper portion.

In the light-emitting device and the light-emitting device package described above, a silicon substrate may be used to grow a light-emitting structure, and a silicon-based support substrate may be used to remove the growth substrate. In this case, the thermal expansion coefficient of the growth substrate is substantially equal to the thermal expansion coefficient of the support substrate. Therefore, when the support substrate is attached, and when the growth substrate is removed, the stress generated at the wafer is minimized and thus the wafer is little warped. Accordingly, in manufacturing the above-described chips or chip-scale packages, handling may be easy and the yield may be improved.

Figure 30:
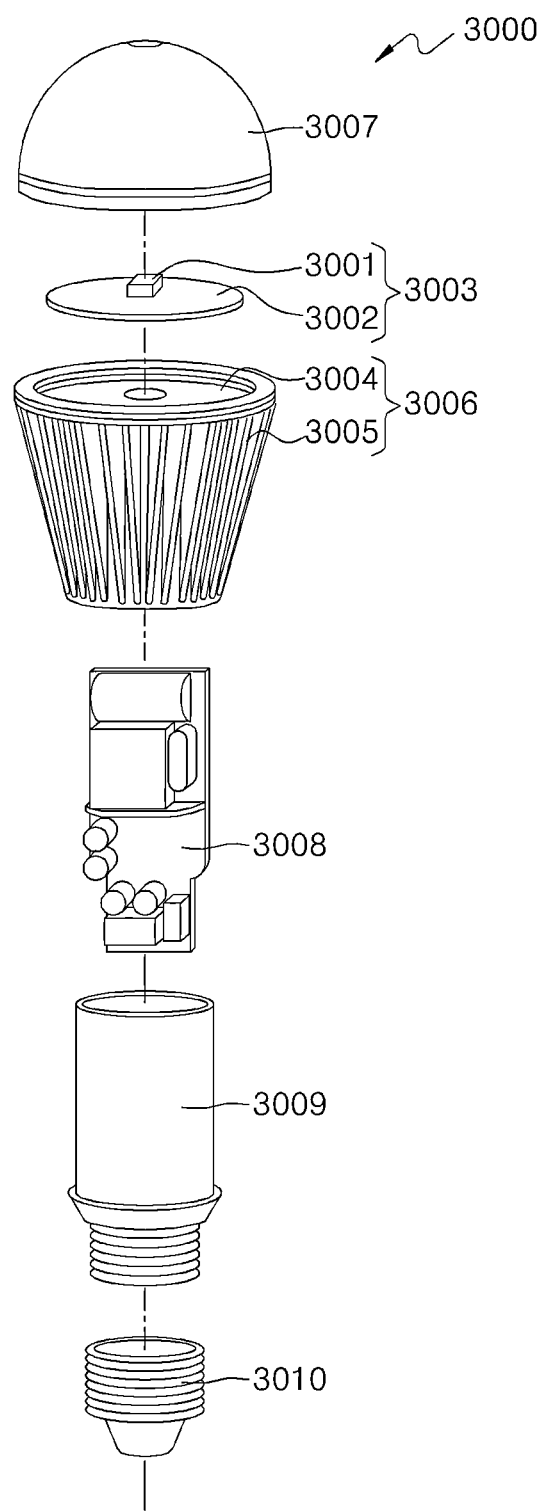
FIG. 30 is an exploded perspective view of an example of an illumination device using a light-emitting device package according to an embodiment of the present invention.

FIG. 30 is an exploded perspective view of an example of an illumination device 3000 using a light-emitting device package according to an embodiment of the present invention.

Referring to FIG. 30, a bulb-type lamp is illustrated as an example of the illumination device 3000, and the illumination device 3000 includes a light-emitting module 3003, a driving unit 3008, and an external connection portion 3010. Also, the illumination device 3000 may further include external structures such as an external housing 3006, an internal housing 3009, and a cover portion 3007.

The light-emitting module 3003 may include a light-emitting device package 3001 and a circuit board 3002 on which the light-emitting device package 3001 is mounted. The light-emitting device package 2006 illustrated in FIG. 28 may be used as the light-emitting device package 3001. However, embodiments of the present invention are not limited thereto, and various types of light-emitting device packages manufactured by using a semiconductor buffer structure according to an embodiment of the present invention may be used. In FIG. 30, one light-emitting package 3001 is mounted on the circuit board 3002; however, a plurality of light-emitting packages 3001 may be mounted thereon when necessary. In this case, the plurality of light-emitting packages 3001 may be the same type of light-emitting packages that emit light of the same wavelength. Alternatively, the plurality of light-emitting packages 3001 may be different types of light-emitting packages that emit light of different wavelengths. For example, the light-emitting package 3001 may be configured to include at least one of a light-emitting device for emitting white light by combination of a blue LED and a yellow, green, red or orange fluorescent substance, a violet light-emitting device, a blue light-emitting device, a green light-emitting device, a red light-emitting device, and an infrared light-emitting device. In this case, the illumination device 3000 may adjust a color rendering index (CRI) from a natrium (Na) lamp (40) level to a solar light (100) level, and may generate various white lights with color temperatures ranging from a candlelight (1500K) level to a blue sky (12000K) level. Also, when necessary, the illumination device 3000 may generate violet, blue, green, red or orange visible light or infrared light to adjust the color of illumination according to atmospheres and feelings. Also, the illumination device 3000 may generate a specific wavelength of light for accelerating the growth of plants.

Also, the light-emitting module 3003 may include the external housing 3006 that acts as a heat dissipation portion. The external housing 3006 may include a heat dissipation plate 3004 that directly contacts the light-emitting module 3003 to improve a heat-sink effect. Also, the illumination device 3000 may include a cover portion 3007 that is mounted on the light-emitting module 3003 and has the shape of a convex lens. The driving unit 3008 may be installed in the internal housing 3009 and connected to the external connection portion 310 having a socket structure, to receive power from an external power supply. The driving unit 3008 converts the power into a suitable current source for driving the semiconductor light-emitting device 3001 of the light-emitting module 3003. For example, the driving unit 3008 may include an AC-DC converter or a rectification circuit component.

For a better understanding of the present invention, the semiconductor devices according to the embodiments of the present invention have been described with reference to the accompanying drawings. However, those of ordinary skill in the art will understand that the embodiments are merely exemplary and various modifications may be made therein. Therefore, the scope of the invention should be defined by the appended claims.

It should be understood that the exemplary embodiments described therein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims.

What is claimed is:

1. A method of manufacturing a semiconductor device, comprising:
    forming a buffer layer on a silicon substrate;
    forming an interface control layer on the buffer layer under a first growth condition; and
    forming a nitride stack on the interface control layer under a second growth condition different from the first growth condition,
    the first growth condition and the second growth condition being controlled such that a ratio of a minimum value of a center value of reflectivity oscillation of the interface control layer to a maximum value of a center value of reflectivity oscillation of the nitride stack has a range of about 0.8 or more, and
    the interface control layer being formed at a first temperature of higher than about 900° C. and lower than about 1000° C., and the nitride stack is formed at a second temperature higher than the first temperature.

2. The method of claim 1, wherein the ratio of the minimum value of the center value of reflectivity oscillation of the interface control layer to the maximum value of the center value of reflectivity oscillation of the nitride stack has a range of about 0.9 or more.

3. The method of claim 1, wherein the interface control layer being formed under at least one different condition of temperature, pressure and thickness from the nitride stack.

4. The method of claim 1, wherein the interface control layer is formed at a first pressure of about 20 torr to about 500 torr, and the nitride stack is formed at a second pressure equal to or higher than the first pressure.

5. The method of claim 1, wherein the interface control layer is formed to have a thickness of about 2 nm to about 1000 nm.

6. The method of claim 1, wherein the interface control layer and the nitride stack axe formed of a Group V/III compound, and the interface control layer has a Group V material-to-Group III material molar composition ratio of about 20 to about 2000 in growth.

7. The method of claim 1, wherein the interface control layer is formed directly on the buffer layer with no other layer interposed therebetween.

8. The method of claim 1, wherein the nitride stack is formed directly on the interface control layer with no other layer interposed therebetween.

9. The method of claim 8, wherein the nitride stack comprises at least one nitride semiconductor layer formed of a gallium nitride.

10. The method of claim 1, wherein the nitride stack comprises a plurality of nitride semiconductor layers that are sequentially formed of homogeneous nitride compounds.

11. The method of claim 1, wherein the nitride stack is formed of $Al_{x1}In_{y1}Ga_{1-x1-y1}N$ where $0 \leq x1$ and $y1 \leq 1$, and $x1+y1 \leq 1$.

12. The method of claim 1, wherein the buffer layer comprises one or more layers, and is formed of $Al_{x2}In_{y2}Ga_{1-x2-y2}N$ where $0 \leq x2$ and $y2 \leq 1$, and $x2+y2 \leq 1$.

13. The method of claim 1, further comprising forming a nucleus growth layer between the silicon substrate and the buffer layer.

14. The method of claim 13, wherein the nucleus growth layer is formed of an aluminum nitride (AlN).

15. The method of claim 1, further comprising removing the silicon substrate and the buffer layer.

16. A semiconductor device comprising: a silicon substrate; a buffer layer on the silicon substrate; an interface control layer on the buffer layer, the interface control layer being formed under a first growth condition; and a nitride stack on the interface control layer, the nitride stack being formed under a second growth condition, wherein the first growth condition and the second growth condition are controlled such that a ratio of a minimum value of a center value of reflectivity oscillation of the interface control layer to a maximum value of a center value of reflectivity oscillation of the nitride stack has a range of about 0.8 or more, and the interface control layer having a thickness of about 2 nm to about 640 nm.

17. The semiconductor device of claim 16, wherein the ratio of the minimum value of the center value of reflectivity oscillation of the interface control layer to the maximum value of the center value of reflectivity oscillation of the nitride stack has a range of about 0.9 or more.

18. The semiconductor device of claim 16, wherein the interface control layer is formed of $Al_{x3}In_{y3}Ga_{1-x3-y3}N$ where 0≤x3 and y3≤1, and x3+y3<1.

19. The semiconductor device of claim 16, wherein the interface control layer is formed of a Group V/III compound, and the interface control layer has a Group V material-to-Group III material molar composition ratio of about 20 to about 2000 in growth.

* * * * *